(12) United States Patent
Matsudai et al.

(10) Patent No.: US 11,955,477 B2
(45) Date of Patent: Apr. 9, 2024

(54) SEMICONDUCTOR DEVICE AND SEMICONDUCTOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomoko Matsudai, Tokyo (JP); Yoko Iwakaji, Tokyo (JP); Ryohei Gejo, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 25 days.

(21) Appl. No.: 17/941,756

(22) Filed: Sep. 9, 2022

(65) Prior Publication Data
US 2023/0307444 A1 Sep. 28, 2023

(30) Foreign Application Priority Data
Mar. 22, 2022 (JP) ................. 2022-045799

(51) Int. Cl.
*H01L 29/739* (2006.01)
*H01L 27/06* (2006.01)
(Continued)

(52) U.S. Cl.
CPC ...... *H01L 27/0664* (2013.01); *H01L 29/7397* (2013.01); *H01L 29/8613* (2013.01); *H03K 17/567* (2013.01)

(58) Field of Classification Search
CPC ............ H01L 27/0664; H01L 29/7397; H01L 29/8613
See application file for complete search history.

(56) References Cited

U.S. PATENT DOCUMENTS 9,379,224 B2 6/2016 Soeno
9,793,266 B2 10/2017 Kameyama et al.
(Continued)

FOREIGN PATENT DOCUMENTS

JP 4398719 B2 1/2010
JP 2013-251395 A 12/2013
(Continued)

OTHER PUBLICATIONS

Sakano et al. "Ultra-Low Switching Loss Triple-Gate controlled IGBT," The 33rd International Symposium on Power Semiconductor Devices and ICs (ISPSD), Nagoya Full Virtual Conference, May 30-Jun. 3, 2021, pp. 363-366.

*Primary Examiner* — Sibin Chen
(74) *Attorney, Agent, or Firm* — Kim & Stewart LLP

(57) ABSTRACT

A semiconductor device according to the embodiment includes: a transistor region including a first trench, a first gate electrode provided in the first trench, a second trench, a second gate electrode provided in the second trench, a third trench, and a third gate electrode provided in the third trench; a diode region including a fifth trench and a conductive layer provided in the fifth trench; a boundary region including a fourth trench and a fourth gate electrode provided in the fourth trench, the boundary region being provided between the transistor region and the diode region; a first electrode pad electrically connected to the first gate electrode; a second electrode pad electrically connected to the second gate electrode; and a third electrode pad electrically connected to the third gate electrode and the fourth gate electrode.

11 Claims, 15 Drawing Sheets

(51) Int. Cl.
*H01L 29/861* (2006.01)
*H03K 17/567* (2006.01)

(56) References Cited

U.S. PATENT DOCUMENTS

| | | | |
|---|---|---|---|
| 10,763,345 B2* | 9/2020 | Murakawa | H01L 29/861 |
| 2005/0161768 A1 | 7/2005 | Sugiyama et al. | |
| 2016/0079369 A1* | 3/2016 | Ogura | H01L 29/8613 |
| | | | 257/140 |
| 2016/0351561 A1* | 12/2016 | Senoo | H01L 29/872 |
| 2017/0250269 A1* | 8/2017 | Sumitomo | H01L 29/407 |
| 2020/0303527 A1* | 9/2020 | Matsudai | H01L 29/1095 |
| 2021/0091072 A1 | 3/2021 | Matsudai et al. | |
| 2021/0281258 A1 | 9/2021 | Sakano et al. | |
| 2021/0296475 A1 | 9/2021 | Iwakaji et al. | |
| 2022/0085193 A1 | 3/2022 | Matsudai et al. | |

FOREIGN PATENT DOCUMENTS

| | | |
|---|---|---|
| JP | 2016-21472 A | 2/2016 |
| JP | 2017-147468 A | 8/2017 |
| JP | 2018-73911 A | 5/2018 |
| JP | 6589817 B2 | 10/2019 |
| JP | 2020-74371 A | 5/2020 |
| JP | 2020-161786 A | 10/2020 |
| JP | 2021-48338 A | 3/2021 |
| JP | 2021-141304 A | 9/2021 |
| WO | 2013/030943 A1 | 3/2013 |

* cited by examiner

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2022-045799, filed on Mar. 22, 2022, the entire contents of which are incorporated herein by reference.

FIELD

Embodiments described herein relate generally to a semiconductor device and a semiconductor circuit.

BACKGROUND

An example of a power semiconductor device includes an insulated gate bipolar transistor (IGBT). In the IGBT, for example, a p-type collector region, an n-type drift region, and a p-type base region are provided on the collector electrode. A gate electrode is provided in a trench penetrating the p-type base region and reaching the n-type drift region with a gate insulating film provided therebetween. An n-type emitter region connected to an emitter electrode is provided in a region adjacent to the trench on the surface of the p-type base region.

Recently, a reverse-conducting IGBT (RC-IGBT) in which the IGBT and a freewheeling diode are formed on the same semiconductor chip has been widely developed and commercialized. The RC-IGBT is used, for example, as a switching element of an inverter circuit. The freewheeling diode has a function of causing a current to flow in a direction opposite to an on-current of the IGBT. Forming the IGBT and the freewheeling diode on the same semiconductor chip has many advantages such as reduction in chip size due to sharing of a termination region and dispersion of a heat generating portion.

In most of the RC-IGBT, a boundary region without the IGBT and the diode is provided between a transistor region including the IGBT and a diode region including the diode. By providing the boundary region, the operation of the IGBT and the operation of the diode are prevented from interfering with each other, and degradation of device characteristics of the RC-IGBT is suppressed.

BRIEF DESCRIPTION OF THE DRAWINGS

FIG. 2 is a partial schematic cross-sectional view of a semiconductor device according to the first embodiment;

DETAILED DESCRIPTION

Figure 1:
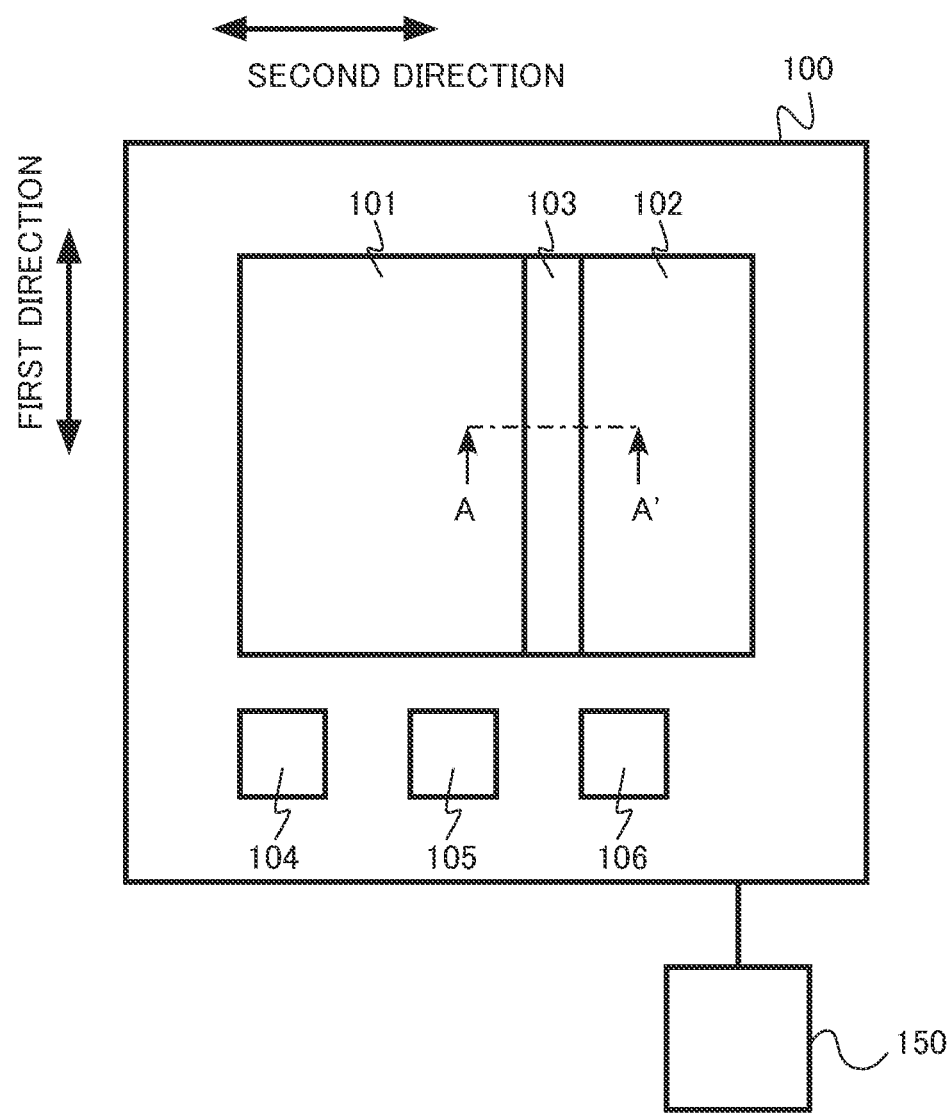
FIG. 1 is a schematic view of a semiconductor circuit according to a first embodiment.

A semiconductor device according to the embodiment includes: a transistor region including a semiconductor layer having a first face and a second face opposed to the first face, a first semiconductor region of a first conductivity type, which is provided in the semiconductor layer, a second semiconductor region of a second conductivity type, which is provided in the semiconductor layer and provided between the first semiconductor region and the first face, a third semiconductor region of a first conductivity type, which is provided in the semiconductor layer and provided between the second semiconductor region and the first face, a fourth semiconductor region of a second conductivity type, which is provided in the semiconductor layer and provided between the third semiconductor region and the first face, a fifth semiconductor region of a first conductivity type, which is provided in the semiconductor layer, provided between the third semiconductor region and the first face, and having a first conductivity type impurity concentration higher than the first conductivity type impurity concentration of the third semiconductor region, a first trench provided on a side of the first face in the semiconductor layer and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided on a side of the first face in the semiconductor layer and in contact with the second semiconductor region, the third semiconductor region, and the fourth semiconductor region, a second gate electrode provided in the second trench, a second gate insulating film provided between the second gate electrode and the second semiconductor region, between the second gate electrode and the third semiconductor region, and between the second gate electrode and the fourth semiconductor region, a third trench provided on a side of the first face in the semiconductor layer and in contact with the second semiconductor region, the third semiconductor region, and the fourth semiconductor region, a third gate electrode provided in the third trench, a third gate insulating film provided between the third gate electrode and the second semiconductor region, between the third gate electrode and the third semiconductor region, and between the third gate electrode and the fourth semiconductor region, a first electrode provided on a side of the first face with respect to the semiconductor layer and in contact with the fourth semiconductor region and the fifth semiconductor region, and a second electrode provided on a side of the second face with respect to the semiconductor layer and in contact with the first semiconductor region; a diode region including the semiconductor layer, the second semiconductor region, a sixth semiconductor region of a second conductivity type, which is provided in the semiconductor layer, provided between the second semiconductor region and the second face, and has a second conductivity type impurity concentration higher than the second conductivity type impurity concentration of the second semiconductor region, a seventh semiconductor region of a first conductivity type, which is provided in the semiconductor layer and provided between the second semiconductor region and the first face, an eighth semiconductor region of a first conductivity type, which is provided in the semiconductor layer, provided between the seventh semiconductor region and the first face, and has a first conductivity type impurity concentration higher than the first conductivity type impurity concentration of the seventh semiconductor region, a fifth trench provided on a side of the first face in the semiconductor layer and in contact with the second semiconductor region and the seventh semiconductor region, a conductive layer provided in the fifth trench, an insulating film provided between the conductive layer and the second semiconductor region and between the conductive layer and the seventh semiconductor region, the first electrode in contact with the eighth semiconductor region, and the second electrode in contact with the sixth semiconductor region; a boundary region including the semiconductor layer, the second semiconductor region, a ninth semiconductor region of a first conductivity type, which is provided in the semiconductor layer and provided between the second semiconductor region and the first face, a tenth semiconductor region of a second conductivity type, which is provided in the semiconductor layer and provided between the ninth semiconductor region and the first face, an eleventh semiconductor region of a first conductivity type, which is provided in the semiconductor layer, provided between the ninth semiconductor region and the first face, and has a first conductivity type impurity concentration higher than the first conductivity type impurity concentration of the ninth semiconductor region, a fourth trench provided on a side of the first face in the semiconductor layer and in contact with the second semiconductor region, the ninth semiconductor region, and the tenth semiconductor region, a fourth gate electrode provided in the fourth trench, a fourth gate insulating film provided between the fourth gate electrode and the second semiconductor region, between the fourth gate electrode and the ninth semiconductor region, and between the fourth gate electrode and the tenth semiconductor region, the first electrode in contact with the tenth semiconductor region and the eleventh semiconductor region, and the second electrode, the boundary region being provided between the transistor region and the diode region; a first electrode pad provided on a side of the first face with respect to the semiconductor layer and electrically connected to the first gate electrode; a second electrode pad provided on a side of the first face with respect to the semiconductor layer and electrically connected to the second gate electrode; and a third electrode pad provided on a side of the first face with respect to the semiconductor layer and electrically connected to the third gate electrode and the fourth gate electrode.

Hereinafter, embodiments of the present disclosure will be described with reference to the drawings. In the following description, the same or similar members are denoted by the same reference numerals, and the description of the members described once is appropriately omitted.

In the present specification, in a case where there are notations of $n^+$-type, n-type, and $n^-$-type, it means that an n-type impurity concentration decreases in order of $n^+$-type, n-type, and $n^-$-type. In a case where there are notations of $p^+$-type, p-type, and $p^-$-type, it means that a p-type impurity concentration decreases in order of $p^+$-type, p-type, and $p^-$-type.

In the present specification, the n-type impurity concentration does not indicate an actual n-type impurity concentration, but indicates an effective n-type impurity concentration after compensation. Similarly, the p-type impurity concentration does not indicate an actual p-type impurity concentration, but indicates an effective p-type impurity concentration after compensation. For example, in a case where the actual n-type impurity concentration is higher than the actual p-type impurity concentration, the concentration obtained by subtracting the p-type impurity concentration from the actual n-type impurity concentration is defined as an n-type impurity concentration. The same applies to the p-type impurity concentration.

In the present specification, the distribution and absolute value of the impurity concentration of a semiconductor region can be measured using, for example, secondary ion mass spectrometry (SIMS). A relative magnitude relationship between the impurity concentrations of two semiconductor regions can be determined using, for example, scanning capacitance microscopy (SCM). The distribution and absolute value of the impurity concentration can be measured using, for example, a spreading resistance analysis (SRA). In the SCM and the SRA, the relative magnitude relationship and absolute value of carrier concentration of the semiconductor region are obtained. By assuming an activation rate of the impurity, it is possible to obtain the relative magnitude relationship between the impurity concentrations of two semiconductor regions, the distribution of the impurity concentration, and the absolute value of the impurity concentration from the measurement results of the SCM and the SRA.

In the present specification, for convenience of an operation description, a transistor portion driven using a first gate electrode in a semiconductor device may be referred to as a "transistor having a first gate electrode". Similarly, a transistor portion driven using a second gate electrode may be referred to as a "transistor having a second gate electrode", a transistor portion driven using a third gate electrode may be referred to as a "transistor having a third gate electrode", and a transistor portion driven using a fourth gate electrode may be referred to as a "transistor having a fourth gate electrode".

First Embodiment

A semiconductor device according to the first embodiment includes: a transistor region including a semiconductor layer having a first face and a second face opposed to the first face, a first semiconductor region of a first conductivity type, which is provided in the semiconductor layer, a second semiconductor region of a second conductivity type, which is provided in the semiconductor layer and provided between the first semiconductor region and the first face, a third semiconductor region of a first conductivity type, which is provided in the semiconductor layer and provided between the second semiconductor region and the first face, a fourth semiconductor region of a second conductivity type, which is provided in the semiconductor layer and provided between the third semiconductor region and the first face, a fifth semiconductor region of a first conductivity type, which is provided in the semiconductor layer, provided between the third semiconductor region and the first face, and has a first conductivity type impurity concentration higher than the first conductivity type impurity concentration of the third semiconductor region, a first trench provided on a side of the first face in the semiconductor layer and in contact with the second semiconductor region, the third semiconductor region, and the fourth semiconductor region, a first gate electrode provided in the first trench, a first gate insulating film provided between the first gate electrode and the second semiconductor region, between the first gate electrode and the third semiconductor region, and between the first gate electrode and the fourth semiconductor region, a second trench provided on a side of the first face in the semiconductor layer and in contact with the second semiconductor region, the third semiconductor region, and the fourth semiconductor region; a second gate electrode provided in the second trench, a second gate insulating film provided between the second gate electrode and the second semiconductor region, between the second gate electrode and the third semiconductor region, and between the second gate electrode and the fourth semiconductor region, a third trench provided on a side of the first face in the semiconductor layer and in contact with the second semiconductor region, the third semiconductor region, and the fourth semiconductor region, a third gate electrode provided in the third trench, a third gate insulating film provided between the third gate electrode and the second semiconductor region, between the third gate electrode and the third semiconductor region, and between the third gate electrode and the fourth semiconductor region, a first electrode provided on a side of the first face with respect to the semiconductor layer and in contact with the fourth semiconductor region and the fifth semiconductor region, and a second electrode provided on a side of the second face with respect to the semiconductor layer and in contact with the first semiconductor region; a diode region including the semiconductor layer, the second semiconductor region, a sixth semiconductor region of a second conductivity type, which is provided in the semiconductor layer, provided between the second semiconductor region and the second face, and has a second conductivity type impurity concentration higher than the second conductivity type impurity concentration of the second semiconductor region, a seventh semiconductor region of a first conductivity type, which is provided in the semiconductor layer and provided between the second semiconductor region and the first face, an eighth semiconductor region of a first conductivity type, which is provided in the semiconductor layer, provided between the seventh semiconductor region and the first face, and has a first conductivity type impurity concentration higher than the first conductivity type impurity concentration of the seventh semiconductor region, a fifth trench provided on a side of the first face in the semiconductor layer and in contact with the second semiconductor region and the seventh semiconductor region, a conductive layer provided in the fifth trench, an insulating film provided between the conductive layer and the second semiconductor region and between the conductive layer and the seventh semiconductor region, the first electrode in contact with the eighth semiconductor region, and the second electrode in contact with the sixth semiconductor region; a boundary region including the semiconductor layer, the second semiconductor region, a ninth semiconductor region of a first conductivity type, which is provided in the semiconductor layer and provided between the second semiconductor region and the first face, a tenth semiconductor region of a second conductivity type, which is provided in the semiconductor layer and provided between the ninth semiconductor region and the first face, an eleventh semiconductor region of a first conductivity type, which is provided in the semiconductor layer, provided between the ninth semiconductor region and the first face, and has a first conductivity type impurity concentration higher than the first conductivity type impurity concentration of the ninth semiconductor region, a fourth trench provided on a side of the first face in the semiconductor layer and in contact with the second semiconductor region, the ninth semiconductor region, and the tenth semiconductor region, a fourth gate electrode provided in the fourth trench, a fourth gate insulating film provided between the fourth gate electrode and the second semiconductor region, between the fourth gate electrode and the ninth semiconductor region, and between the fourth gate electrode and the tenth semiconductor region, the first electrode in contact with the tenth semiconductor region and the eleventh semiconductor region, and the second electrode, the boundary region being provided between the transistor region and the diode region; a first electrode pad provided on a side of the first face with respect to the semiconductor layer and electrically connected to the first gate electrode; a second electrode pad provided on a side of the first face with respect to the semiconductor layer and electrically connected to the second gate electrode; and a third electrode pad provided on a side of the first face with respect to the semiconductor layer and electrically connected to the third gate electrode and the fourth gate electrode.

A semiconductor circuit of the first embodiment includes a control circuit that drives the semiconductor device.

The semiconductor device of the first embodiment is an RC-IGBT 100 in which an IGBT and a freewheeling diode are formed on the same semiconductor chip. The RC-IGBT 100 includes a trench-gate IGBT including a gate electrode in a trench formed in a semiconductor layer. Hereinafter, a case where a first conductivity type is p-type and a second conductivity type is n-type will be described as an example.

The control circuit of the first embodiment is a gate driver circuit 150. The semiconductor circuit of the first embodiment includes the semiconductor device and the control circuit that controls the semiconductor device. The semiconductor circuit is, for example, a semiconductor module on which the RC-IGBT 100 and the gate driver circuit 150 are mounted.

FIG. 1 is a schematic view of the semiconductor circuit according to the first embodiment.

Figure 2:
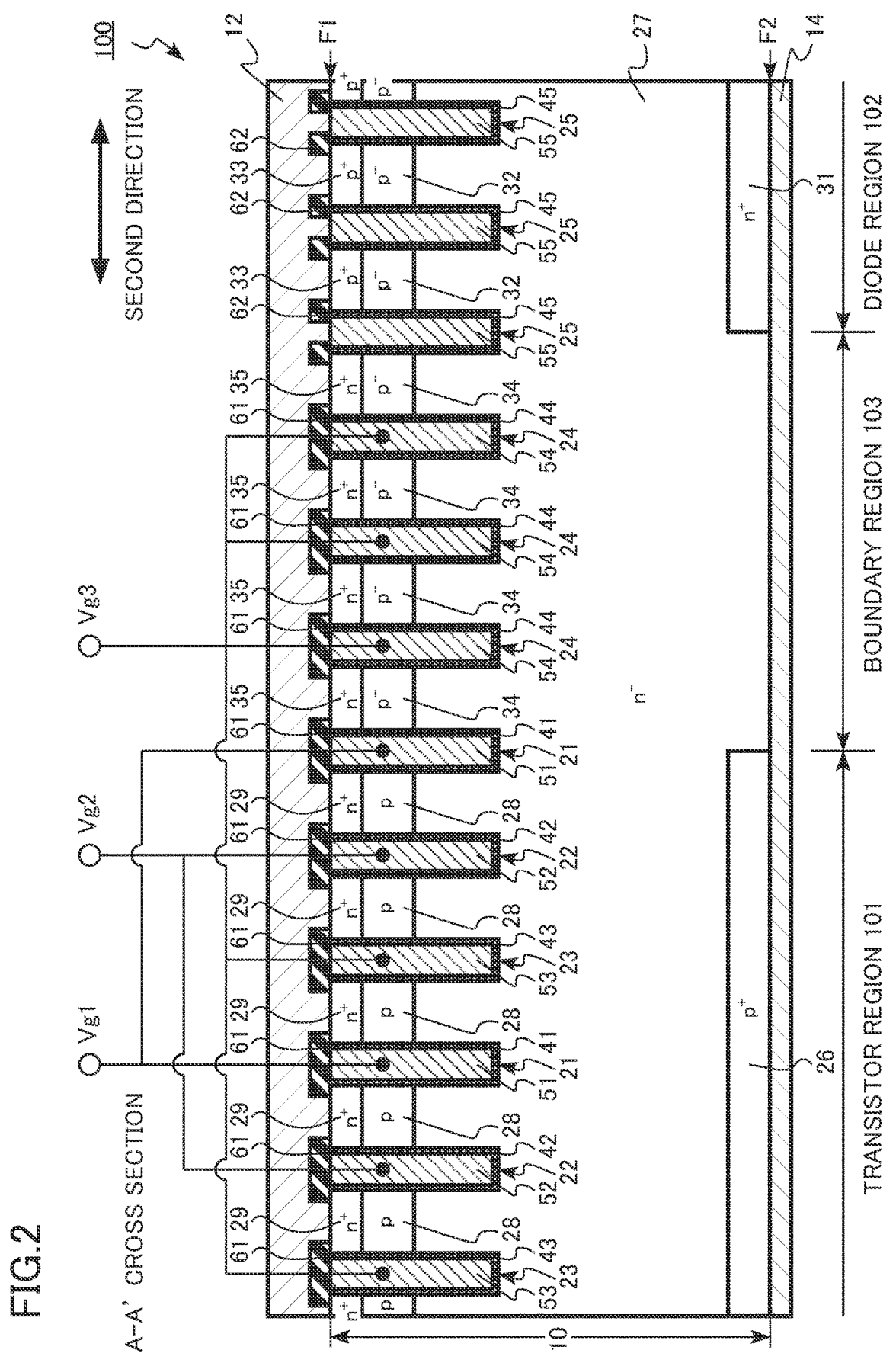

FIG. 2 is a partial schematic cross-sectional view of the semiconductor device according to the first embodiment. FIG. 2 is a cross-sectional view taken along line A-A' of FIG. 1.

Figure 3:
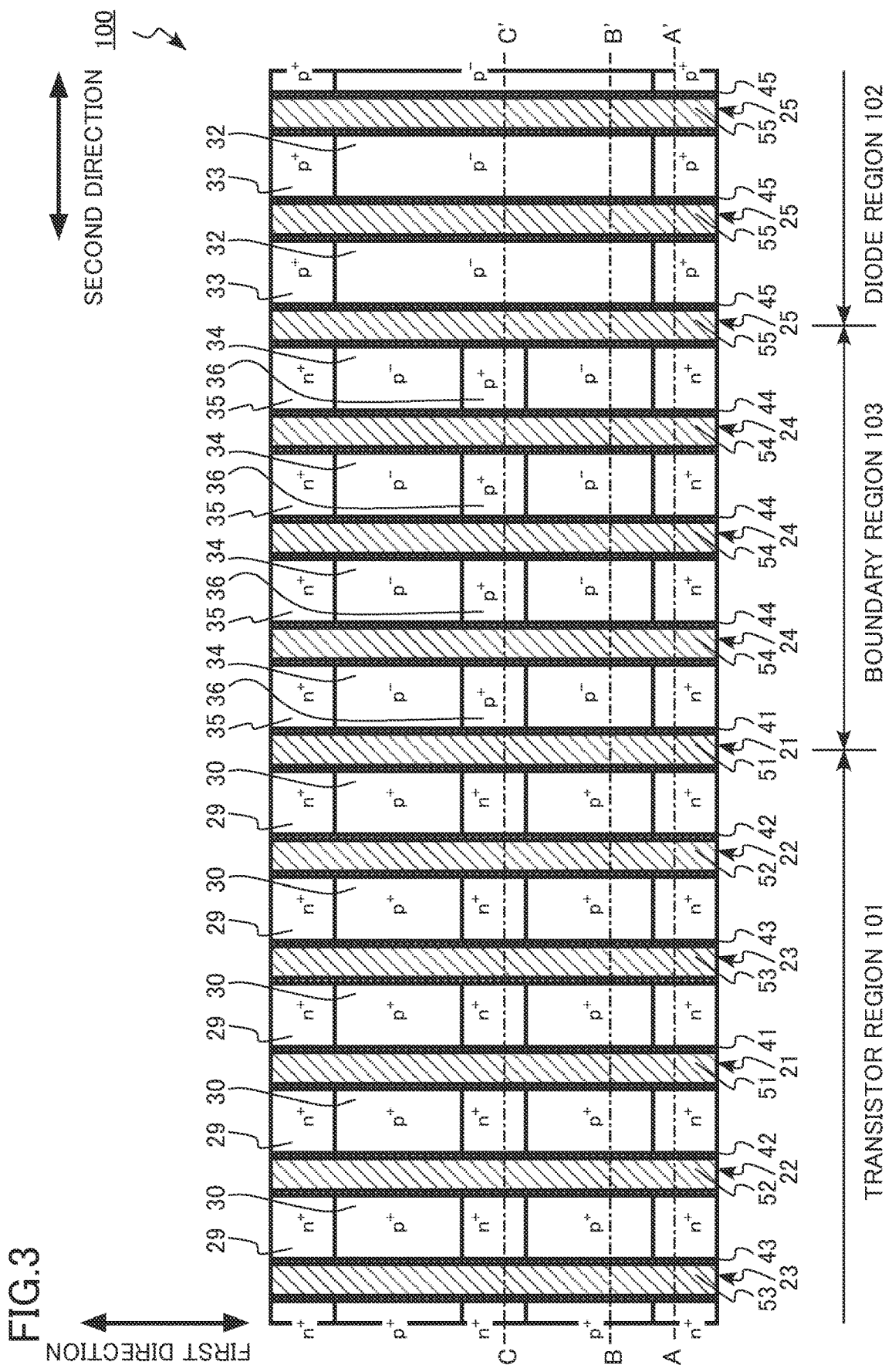
FIG. 3 is a partial schematic top view of the semiconductor device according to the first embodiment.

FIG. 3 is a partial schematic top view of the semiconductor device according to the first embodiment.

FIG. 3 is a top view of a first face F1. FIG. 2 is a cross-sectional view taken along line A-A' of FIG. 3.

Figure 4:
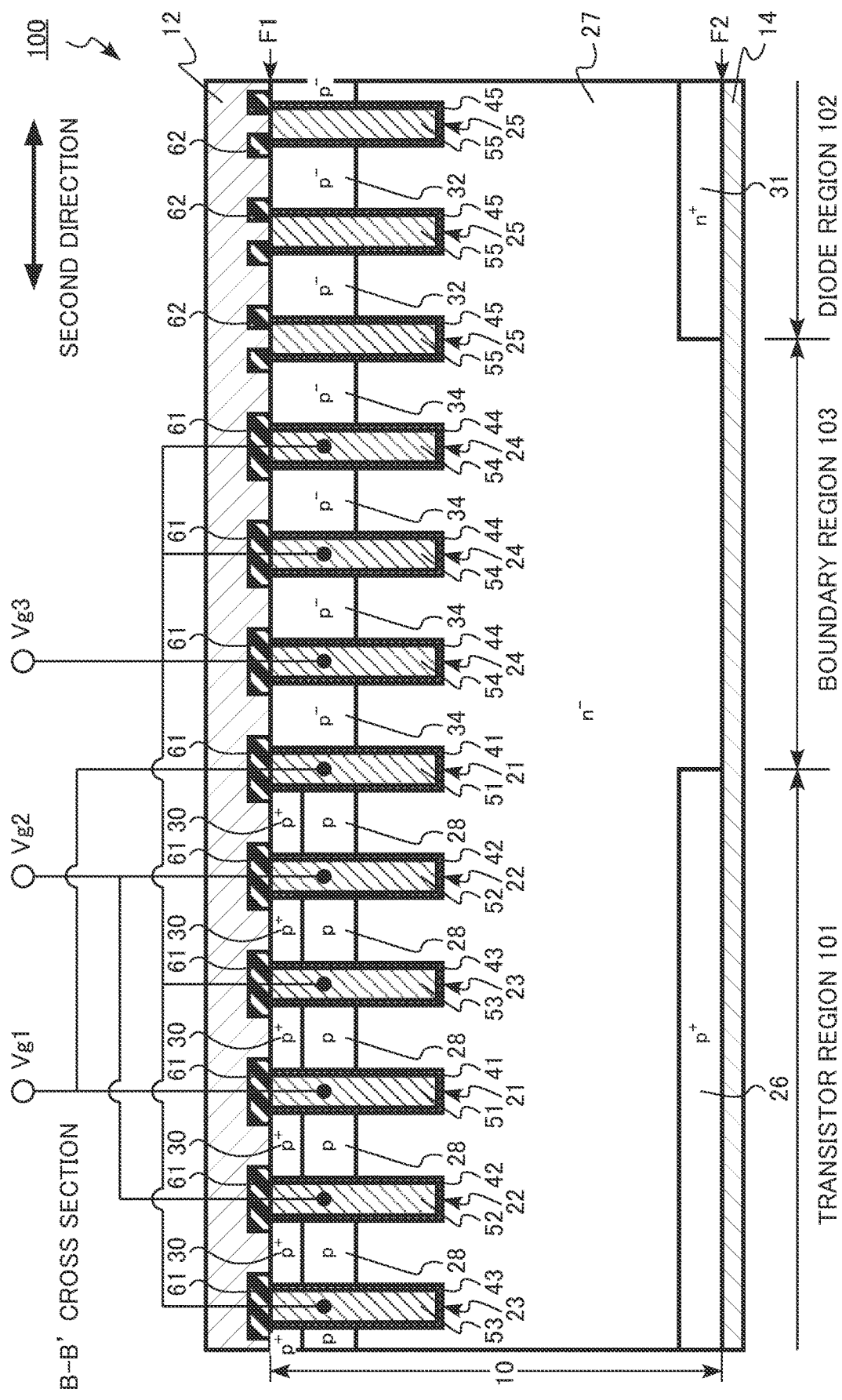
FIG. 4 is a partial schematic cross-sectional view of the semiconductor device according to the first embodiment.

FIG. 4 is a partial schematic cross-sectional view of the semiconductor device according to the first embodiment. FIG. 4 is a cross-sectional view taken along line B-B' of FIG. 3.

Figure 5:
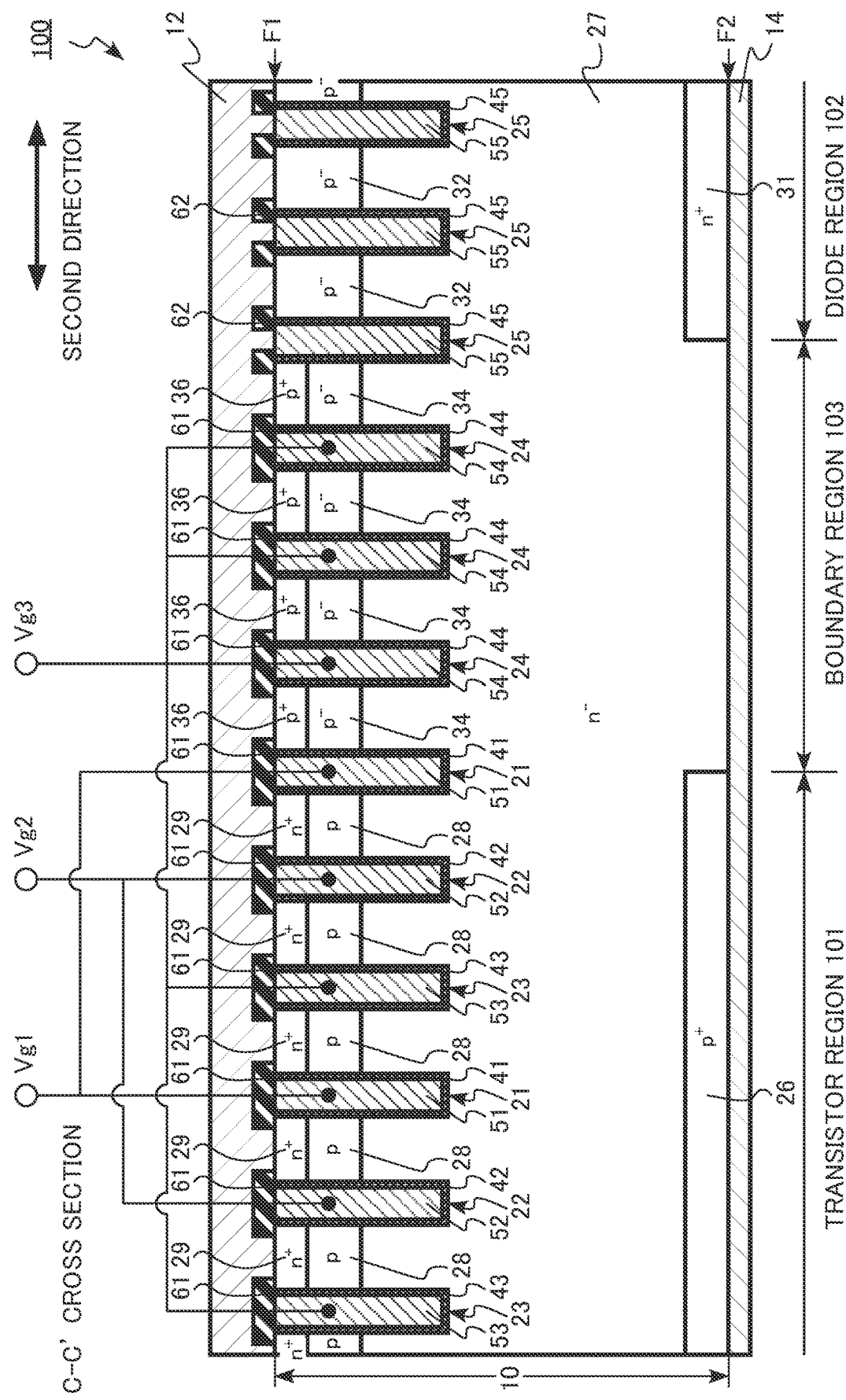
FIG. 5 is a partial schematic cross-sectional view of the semiconductor device according to the first embodiment.

FIG. 5 is a partial schematic cross-sectional view of the semiconductor device according to the first embodiment. FIG. 5 is a cross-sectional view taken along line C-C' of FIG. 3.

The semiconductor circuit of the first embodiment includes the RC-IGBT 100 and the gate driver circuit 150. The RC-IGBT 100 includes a transistor region 101, a diode region 102, and a boundary region 103. The boundary region 103 is provided between the transistor region 101 and the diode region 102.

The RC-IGBT 100 is an example of the semiconductor device. The gate driver circuit 150 is an example of the control circuit.

The transistor region 101 operates as the IGBT. The diode region 102 operates as the freewheeling diode. The freewheeling diode is, for example, a fast recovery diode (FRD).

The RC-IGBT 100 of the first embodiment includes a semiconductor layer 10, an upper electrode 12 (first electrode), a lower electrode 14 (second electrode), a first gate insulating film 41, a second gate insulating film 42, a third gate insulating film 43, a fourth gate insulating film 44, a diode insulating film 45 (insulating film), a first gate electrode 51, a second gate electrode 52, a third gate electrode 53, a fourth gate electrode 54, a diode conductive layer 55 (conductive layer), a first interlayer insulating layer 61, a second interlayer insulating layer 62, a first gate electrode pad 104 (first electrode pad), a second gate electrode pad 105 (second electrode pad), and a third gate electrode pad 106 (third electrode pad).

In the semiconductor layer 10, a first gate trench 21 (first trench), a second gate trench 22 (second trench), a third gate trench 23 (third trench), a fourth gate trench 24 (fourth trench), a diode trench 25 (fifth trench), a collector region 26 (first semiconductor region), a drift region 27 (second semiconductor region), a cell base region 28 (third semiconductor region), a cell emitter region 29 (fourth semiconductor region), a cell contact region 30 (fifth semiconductor region), a cathode region 31 (sixth semiconductor region), an anode region 32 (seventh semiconductor region), a diode contact region 33 (eighth semiconductor region), a boundary base region 34 (ninth semiconductor region), a boundary emitter region 35 (tenth semiconductor region), and a boundary contact region 36 (eleventh semiconductor region) are provided.

The semiconductor layer 10 has a first face F1 and a second face F2 opposed to the first face F1. The semiconductor layer 10 is formed of, for example, single crystal silicon. The thickness of the semiconductor layer 10 is, for example, equal to or greater than 40 μm and equal to or less than 700 μm.

In the present specification, a direction parallel to the first face F1 is referred to as a first direction. A direction parallel to the first face F1 and orthogonal to the first direction is referred to as a second direction. In the present specification, a "depth" is defined as a distance in a direction toward the second face F2 with respect to the first face F1.

The transistor region 101 includes the semiconductor layer 10, the upper electrode 12 (first electrode), the lower electrode 14 (second electrode), the first gate insulating film 41, the second gate insulating film 42, the third gate insulating film 43, the first gate electrode 51, the second gate electrode 52, the third gate electrode 53, and the first interlayer insulating layer 61.

In the semiconductor layer 10 of the transistor region 101, the first gate trench 21 (first trench), the second gate trench 22 (second trench), the third gate trench 23 (third trench), the collector region 26 (first semiconductor region), the drift region 27 (second semiconductor region), the cell base region 28 (third semiconductor region), the cell emitter region 29 (fourth semiconductor region), and the cell contact region 30 (fifth semiconductor region) are provided.

The upper electrode 12 is provided on the first face F1 side of the semiconductor layer 10. At least a part of the upper electrode 12 is in contact with the first face F1 of the semiconductor layer 10.

The upper electrode 12 functions as an emitter electrode of the IGBT in the transistor region 101. The upper electrode 12 is formed of, for example, metal.

The upper electrode 12 is in contact with the cell emitter region 29. The upper electrode 12 is electrically connected to the cell emitter region 29.

The upper electrode 12 is in contact with the cell contact region 30. The upper electrode 12 is electrically connected to the cell contact region 30. The upper electrode 12 is electrically connected to the cell base region 28 via the cell contact region 30.

The lower electrode 14 is provided on the second face F2 side of the semiconductor layer 10. At least a part of the lower electrode 14 is in contact with the second face F2 of the semiconductor layer 10.

The lower electrode 14 functions as a collector electrode of the IGBT in the transistor region 101. The lower electrode 14 is formed of, for example, metal.

The lower electrode 14 is in contact with the collector region 26 in the transistor region 101. The lower electrode 14 is electrically connected to the collector region 26 in the transistor region 101.

The collector region 26 is a $p^+$-type semiconductor region. The collector region 26 is in contact with the second face F2. The collector region 26 is electrically connected to the lower electrode 14. The collector region 26 is in contact with the lower electrode 14. The collector region 26 is a hole-supply source when the IGBT is in an on-state.

The drift region 27 is an $n^-$-type semiconductor region. The drift region 27 is provided between the collector region 26 and the first face F1.

The drift region 27 is a path of an on-current when the IGBT is in the on-state. The drift region 27 is depleted when the IGBT is in an off-state, and has a function of maintaining a breakdown voltage of the IGBT.

The cell base region 28 is a p-type semiconductor region. The cell base region 28 is provided between the drift region 27 and the first face F1. The drift region 27 is provided between the collector region 26 and the cell base region 28.

The depth of the cell base region 28 is, for example, equal to or less than 5 μm. When the IGBT is in the on-state, an n-type inversion layer is formed in a region of the cell base region 28 opposed to the first gate electrode 51, a region of the cell base region 28 opposed to the second gate electrode 52, and a region of the cell base region 28 opposed to the third gate electrode 53. The cell base region 28 functions as a channel region of the transistor.

The cell emitter region 29 is an $n^+$-type semiconductor region. The cell emitter region 29 is provided between the cell base region 28 and the first face F1.

The cell emitter region 29 is in contact with the first gate insulating film 41, the second gate insulating film 42, and the third gate insulating film 43.

The n-type impurity concentration of the cell emitter region 29 is higher than the n-type impurity concentration of the drift region 27.

The cell emitter region 29 is in contact with the upper electrode 12. The cell emitter region 29 is electrically connected to the upper electrode 12. The cell emitter region 29 is an electron-supply source when a transistor having the first gate electrode 51, a transistor having the second gate electrode 52, and a transistor having the third gate electrode 53 are in an on-state.

The cell contact region 30 is a p+-type semiconductor region. The cell contact region 30 is provided between the cell base region 28 and the first face F1. The cell contact region 30 is in contact with the upper electrode 12. The cell contact region 30 is electrically connected to the upper electrode 12.

The p-type impurity concentration of the cell contact region 30 is higher than the p-type impurity concentration of the cell base region 28.

The first gate trench 21 is provided on the first face F1 side of the semiconductor layer 10. The first gate trench 21 is a groove provided in the semiconductor layer 10. The first gate trench 21 is a part of the semiconductor layer 10.

As illustrated in FIG. 3, on the first face F1, the first gate trench 21 extends in the first direction parallel to the first face F1. The first gate trench 21 has a stripe shape. A plurality of the first gate trenches 21 are repeatedly disposed in the second direction orthogonal to the first direction.

The first gate trench 21 is in contact with the drift region 27, the cell base region 28, and the cell emitter region 29. The first gate trench 21 penetrates the cell base region 28 and reaches the drift region 27. The depth of the first gate trench 21 is, for example, equal to or less than 8 μm.

The first gate electrode 51 is provided in the first gate trench 21. The first gate electrode 51 is formed of, for example, a semiconductor or metal. The first gate electrode 51 is formed of, for example, amorphous silicon or polycrystalline silicon, which contains the n-type impurity or the p-type impurity. The first gate electrode 51 is electrically connected to the first gate electrode pad 104.

The first gate insulating film 41 is provided between the first gate electrode 51 and the semiconductor layer 10. The first gate insulating film 41 is provided between the first gate electrode 51 and the drift region 27, between the first gate electrode 51 and the cell base region 28, and between the first gate electrode 51 and the cell emitter region 29. The first gate insulating film 41 is in contact with the drift region 27, the cell base region 28, and the cell emitter region 29. The first gate insulating film 41 is formed of, for example, silicon oxide.

The second gate trench 22 is provided on the first face F1 side of the semiconductor layer 10. The second gate trench 22 is a groove provided in the semiconductor layer 10. The second gate trench 22 is a part of the semiconductor layer 10.

As illustrated in FIG. 3, on the first face F1, the second gate trench 22 extends in the first direction parallel to the first face F1. The second gate trench 22 has a stripe shape. A plurality of the second gate trenches 22 are repeatedly disposed in the second direction orthogonal to the first direction.

The second gate trench 22 is in contact with the drift region 27, the cell base region 28, and the cell emitter region 29. The second gate trench 22 penetrates the cell base region 28 and reaches the drift region 27. The depth of the second gate trench 22 is, for example, equal to or less than 8 μm.

The second gate electrode 52 is provided in the second gate trench 22. The second gate electrode 52 is formed of, for example, a semiconductor or metal. The second gate electrode 52 is formed of, for example, amorphous silicon or polycrystalline silicon, which contains the n-type impurity or the p-type impurity. The second gate electrode 52 is electrically connected to the second gate electrode pad 105.

The second gate insulating film 42 is provided between the second gate electrode 52 and the semiconductor layer 10. The second gate insulating film 42 is provided between the second gate electrode 52 and the drift region 27, between the second gate electrode 52 and the cell base region 28, and between the second gate electrode 52 and the cell emitter region 29. The second gate insulating film 42 is in contact with the drift region 27, the cell base region 28, and the cell emitter region 29. The second gate insulating film 42 is formed of, for example, silicon oxide.

The third gate trench 23 is provided on the first face F1 side of the semiconductor layer 10. The third gate trench 23 is a groove provided in the semiconductor layer 10. The third gate trench 23 is a part of the semiconductor layer 10.

As illustrated in FIG. 3, on the first face F1, the third gate trench 23 extends in the first direction parallel to the first face F1. The third gate trench 23 has a stripe shape. A plurality of the third gate trenches 23 are repeatedly disposed in the second direction orthogonal to the first direction.

In the transistor region 101, for example, the number of third gate trenches 23 is greater than the number of first gate trenches 21.

The third gate trench 23 is in contact with the drift region 27, the cell base region 28, and the cell emitter region 29. The third gate trench 23 penetrates the cell base region 28 and reaches the drift region 27. The depth of the third gate trench 23 is, for example, equal to or less than 8 μm.

The third gate electrode 53 is provided in the third gate trench 23. The third gate electrode 53 is formed of, for example, a semiconductor or metal. The third gate electrode 53 is formed of, for example, amorphous silicon or polycrystalline silicon, which contains the n-type impurity or the p-type impurity. The third gate electrode 53 is electrically connected to the third gate electrode pad 106.

The third gate insulating film 43 is provided between the third gate electrode 53 and the semiconductor layer 10. The third gate insulating film 43 is provided between the third gate electrode 53 and the drift region 27, between the third gate electrode 53 and the cell base region 28, and between the third gate electrode 53 and the cell emitter region 29. The third gate insulating film 43 is in contact with the drift region 27, the cell base region 28, and the cell emitter region 29. The third gate insulating film 43 is formed of, for example, silicon oxide.

The first interlayer insulating layer 61 is provided between the first gate electrode 51 and the upper electrode 12. The first interlayer insulating layer 61 electrically isolates the first gate electrode 51 from the upper electrode 12. The first interlayer insulating layer 61 is provided between the second gate electrode 52 and the upper electrode 12. The first interlayer insulating layer 61 electrically isolates the second gate electrode 52 from the upper electrode 12. The first interlayer insulating layer 61 is provided between the third gate electrode 53 and the upper electrode 12. The first interlayer insulating layer 61 electrically isolates the third gate electrode 53 from the upper electrode 12. The first interlayer insulating layer 61 is formed of, for example, silicon oxide.

The diode region 102 includes the semiconductor layer 10, the upper electrode 12 (first electrode), the lower electrode 14 (second electrode), the diode insulating film 45 (insulating film), the diode conductive layer 55 (conductive layer), and the second interlayer insulating layer 62.

In the semiconductor layer 10 of the diode region 102, the cathode region 31 (sixth semiconductor region), the drift region 27 (second semiconductor region), the anode region 32 (seventh semiconductor region), and the diode contact region 33 (eighth semiconductor region) are provided.

The upper electrode 12 functions as an anode electrode of the diode in the diode region 102. The upper electrode 12 is in contact with the diode contact region 33. The upper electrode 12 is electrically connected to the diode contact region 33. The upper electrode 12 is electrically connected to the anode region 32 via the diode contact region 33. Alternatively, the upper electrode 12 may be in direct contact with the anode region 32. In this case, for example, the anode region 32 and the upper electrode 12 form a Schottky junction.

The lower electrode 14 functions as a cathode electrode of the diode in the diode region 102. The lower electrode 14 is in contact with the collector region 26.

The cathode region 31 is an $n^+$-type semiconductor region. The cathode region 31 is in contact with the second face F2. The cathode region 31 is an electron-supply source when the diode is in an on-state. The cathode region 31 is in contact with the lower electrode 14.

The drift region 27 is an $n^-$-type semiconductor region. The drift region 27 is provided between the cathode region 31 and the first face F1. The n-type impurity concentration of the drift region 27 is lower than the n-type impurity concentration of the cathode region 31.

The drift region 27 is a path of an on-current when the diode is in an on-state.

The anode region 32 is a p-type semiconductor region. The anode region 32 is provided between the drift region 27 and the first face F1. The drift region 27 is provided between the anode region 32 and the cathode region 31.

The anode region 32 is a hole-supply source when the diode is in the on-state.

For example, the p-type impurity concentration of the anode region 32 is lower than the p-type impurity concentration of the cell base region 28. For example, the p-type impurity concentration of the anode region 32 is lower than the p-type impurity concentration of the boundary base region 34. The depth of the anode region 32 is, for example, equal to the depth of the cell base region 28 and the depth of the boundary base region 34.

The diode contact region 33 is a $p^+$-type semiconductor region. The diode contact region 33 is provided between the anode region 32 and the first face F1.

The diode contact region 33 is in contact with the upper electrode 12. The diode contact region 33 is electrically connected to the upper electrode 12.

The p-type impurity concentration of the diode contact region 33 is higher than the p-type impurity concentration of the anode region 32.

On the first face F1 side of the semiconductor layer 10, the diode trench 25 is provided in contact with the anode region 32. The diode trench 25 is a groove provided in the semiconductor layer 10. The diode trench 25 is a part of the semiconductor layer 10.

As illustrated in FIG. 3, on the first face F1, the diode trench 25 extends in the first direction parallel to the first face F1. The diode trench 25 has a stripe shape. A plurality of the diode trenches 25 are repeatedly disposed in the second direction orthogonal to the first direction.

The diode trench 25 is in contact with the drift region 27 and the anode region 32. The diode trench 25 penetrates the anode region 32 and reaches the drift region 27. The depth of the diode trench 25 is, for example, equal to or less than 8 μm.

The diode conductive layer 55 is provided in the diode trench 25. The diode conductive layer 55 is formed of, for example, a semiconductor or metal. The diode conductive layer 55 is formed of, for example, amorphous silicon or polycrystalline silicon, which contains the n-type impurity or the p-type impurity. For example, the diode conductive layer 55 is electrically connected to the upper electrode 12.

The diode conductive layer 55 can be in a floating state without being fixed at a specific electric potential. The diode conductive layer 55 can be connected to an electrode other than the upper electrode 12, and a voltage different from that of the upper electrode 12 can be applied to the diode conductive layer 55.

The diode insulating film 45 is provided between the diode conductive layer 55 and the semiconductor layer 10. The diode insulating film 45 is provided between the diode conductive layer 55 and the drift region 27 and between the diode conductive layer 55 and the anode region 32. The diode insulating film 45 is in contact with the drift region 27 and the anode region 32. The diode insulating film 45 is formed of, for example, silicon oxide.

The second interlayer insulating layer 62 is provided between the diode conductive layer 55 and the upper electrode 12. For example, the diode conductive layer 55 and the upper electrode 12 are electrically connected by using an opening provided in the second interlayer insulating layer 62.

The boundary region 103 includes the semiconductor layer 10, the upper electrode 12 (first electrode), the lower electrode 14 (second electrode), the fourth gate insulating film 44, the fourth gate electrode 54, and the first interlayer insulating layer 61.

In the semiconductor layer 10 of the boundary region 103, the fourth gate trench 24 (fourth trench), the drift region 27 (second semiconductor region), the boundary base region 34 (ninth semiconductor region), the boundary emitter region 35 (tenth semiconductor region), and the boundary contact region 36 (eleventh semiconductor region) are provided.

The upper electrode 12 functions as an emitter electrode of the IGBT in the boundary region 103. The upper electrode 12 is in contact with the boundary emitter region 35. The upper electrode 12 is electrically connected to the boundary emitter region 35. The upper electrode 12 is electrically connected to the boundary base region 34 via the boundary emitter region 35.

The lower electrode 14 is in contact with the drift region 27 in the boundary region 103. The drift region 27 is an $n^-$-type semiconductor region.

The drift region 27 is a path of an on-current when the IGBT is in the on-state. The drift region 27 is depleted when the IGBT is in an off-state, and has a function of maintaining a breakdown voltage of the IGBT.

The boundary base region 34 is a p-type semiconductor region. The boundary base region 34 is provided between the drift region 27 and the first face F1. The drift region 27 is provided between the boundary base region 34 and the second face F2.

The depth of the boundary base region 34 is, for example, equal to or less than 5 μm. An n-type inversion layer is formed in a region of the boundary base region 34 opposed to the fourth gate electrode 54 when the IGBT is in the on-state. The boundary base region 34 functions as a channel region of the transistor.

For example, the p-type impurity concentration of the boundary base region 34 is lower than the p-type impurity concentration of the cell base region 28. For example, the p-type impurity concentration of the boundary base region 34 is equal to the p-type impurity concentration of the anode region 32. The depth of the boundary base region 34 is, for example, equal to the depth of the cell base region 28 and the depth of the anode region 32.

The boundary emitter region 35 is an $n^+$-type semiconductor region. The boundary emitter region 35 is provided between the boundary base region 34 and the first face F1.

The boundary emitter region 35 is in contact with the fourth gate insulating film 44. The n-type impurity concentration of the boundary emitter region 35 is higher than the n-type impurity concentration of the drift region 27.

The boundary emitter region 35 is in contact with the upper electrode 12. The boundary emitter region 35 is electrically connected to the upper electrode 12. The boundary emitter region 35 is an electron-supply source when a transistor including the fourth gate electrode 54 is in an on-state.

The boundary contact region 36 is a p$^+$-type semiconductor region. The boundary contact region 36 is provided between the boundary base region 34 and the first face F1. The boundary contact region 36 is in contact with the upper electrode 12. The boundary base region 34 is electrically connected to the upper electrode 12.

The p-type impurity concentration of the boundary contact region 36 is higher than the p-type impurity concentration of the boundary base region 34.

For example, as illustrated in FIG. 3, the occupation area ratio of the boundary contact region 36 on the first face F1 of the boundary region 103 is smaller than the occupation area ratio of the cell contact region 30 on the first face F1 of the transistor region 101. For example, the occupation area ratio of the boundary contact region 36 on the first face F1 of the boundary region 103 is equal to or less than half the occupation area ratio of the cell contact region 30 on the first face F1 of the transistor region 101.

The fourth gate trench 24 is provided on the first face F1 side of the semiconductor layer 10. The fourth gate trench 24 is a groove provided in the semiconductor layer 10. The fourth gate trench 24 is a part of the semiconductor layer 10.

As illustrated in FIG. 3, on the first face F1, the fourth gate trench 24 extends in the first direction parallel to the first face F1. The fourth gate trench 24 has a stripe shape. A plurality of the fourth gate trenches 24 are repeatedly disposed in the second direction orthogonal to the first direction.

The fourth gate trench 24 is in contact with the drift region 27, the boundary base region 34, and the boundary emitter region 35. The fourth gate trench 24 penetrates the boundary base region 34 and reaches the drift region 27. The depth of the fourth gate trench 24 is, for example, equal to or less than 8 μm.

The fourth gate electrode 54 is provided in the fourth gate trench 24. The fourth gate electrode 54 is formed of, for example, a semiconductor or metal. The fourth gate electrode 54 is formed of, for example, amorphous silicon or polycrystalline silicon, which contains the n-type impurity or the p-type impurity. The fourth gate electrode 54 is electrically connected to the third gate electrode pad 106.

For example, as illustrated in FIG. 3, the occupation area ratio of the fourth gate electrode 54 in a cross section parallel to the first face F1 of the boundary region 103 is greater than the occupation area ratio of the third gate electrode 53 in the cross section of the transistor region 101. FIG. 3 illustrates a case where the cross section parallel to the first face F1 coincides with the first face F1.

For example, the density of the fourth gate trench 24 in the boundary region 103 is greater than the density of the third trench in the transistor region 101. For example, the density of the transistor having the fourth gate electrode 54 in the boundary region 103 is greater than the density of the transistor having the third gate electrode 53 in the transistor region 101.

The fourth gate insulating film 44 is provided between the fourth gate electrode 54 and the semiconductor layer 10. The fourth gate insulating film 44 is provided between the fourth gate electrode 54 and the drift region 27, between the fourth gate electrode 54 and the boundary base region 34, and between the fourth gate electrode 54 and the boundary emitter region 35. The fourth gate insulating film 44 is in contact with the drift region 27, the boundary base region 34, and the boundary emitter region 35. The fourth gate insulating film 44 is formed of, for example, silicon oxide.

The first interlayer insulating layer 61 is provided between the fourth gate electrode 54 and the upper electrode 12. The first interlayer insulating layer 61 electrically isolates the fourth gate electrode 54 from the upper electrode 12.

The first gate electrode pad 104 is provided on the first face F1 side of the semiconductor layer 10. The first gate electrode pad 104 is electrically connected to the first gate electrode 51. The first gate electrode pad 104 and the first gate electrode 51 are connected by, for example, metal wiring (not illustrated).

A first gate voltage (Vg1) is applied to the first gate electrode pad 104.

For example, a first turn-on voltage (Von1) and a first turn-off voltage (Voff1) are applied to the first gate electrode pad 104.

The second gate electrode pad 105 is provided on the first face F1 side of the semiconductor layer 10. The second gate electrode pad 105 is electrically connected to the second gate electrode 52. The second gate electrode pad 105 and the second gate electrode 52 are connected by, for example, metal wiring (not illustrated).

A second gate voltage (Vg2) is applied to the second gate electrode pad 105. For example, a second turn-on voltage (Von2) and a second turn-off voltage (Voff2) are applied to the second gate electrode pad 105.

The third gate electrode pad 106 is provided on the first face F1 side of the semiconductor layer 10. The third gate electrode pad 106 is electrically connected to the third gate electrode 53 and the fourth gate electrode 54. The third gate electrode pad 106, the third gate electrode 53, and the fourth gate electrode 54 are connected by, for example, metal wiring (not illustrated).

A third gate voltage (Vg3) is applied to the third gate electrode pad 106. For example, a third turn-on voltage (Von3) and a third turn-off voltage (Voff3) are applied to the third gate electrode pad 106.

The gate driver circuit 150 is provided, for example, on the same circuit board as that of the RC-IGBT 100 or on another circuit board. The gate driver circuit 150 has a function of driving the RC-IGBT 100.

The gate driver circuit 150 has a function of applying a desired first gate voltage (Vg1), a desired second gate voltage (Vg2), and a desired third gate voltage (Vg3) to the first gate electrode pad 104, the second gate electrode pad 105, and the third gate electrode pad 106 at a desired timing.

The gate driver circuit 150 applies the first turn-on voltage (Von1) to the first gate electrode pad 104, the second turn-on voltage (Von2) to the second gate electrode pad 105, and the third turn-on voltage (Von3) to the third gate electrode pad 106; applies the third turn-off voltage (Voff3) to the third gate electrode pad 106 after applying the first turn-on voltage (Von1) to the first gate electrode pad 104, the second turn-on voltage (Von2) to the second gate electrode pad 105, and the third turn-on voltage (Von3) to the third gate electrode pad 106; applies the second turn-off voltage (Voff2) to the second gate electrode pad 105 after applying the third turn-off voltage (Voff3) to the third gate electrode pad 106; and applies the first turn-off voltage (Voff1) to the first gate electrode pad 104 after applying the second turn-off voltage (Voff2) to the second gate electrode pad 105.

Next, a driving method for the RC-IGBT 100, in particular, a driving method for the IGBT in the transistor region 101 and the boundary region 103 will be described.

Figure 6:
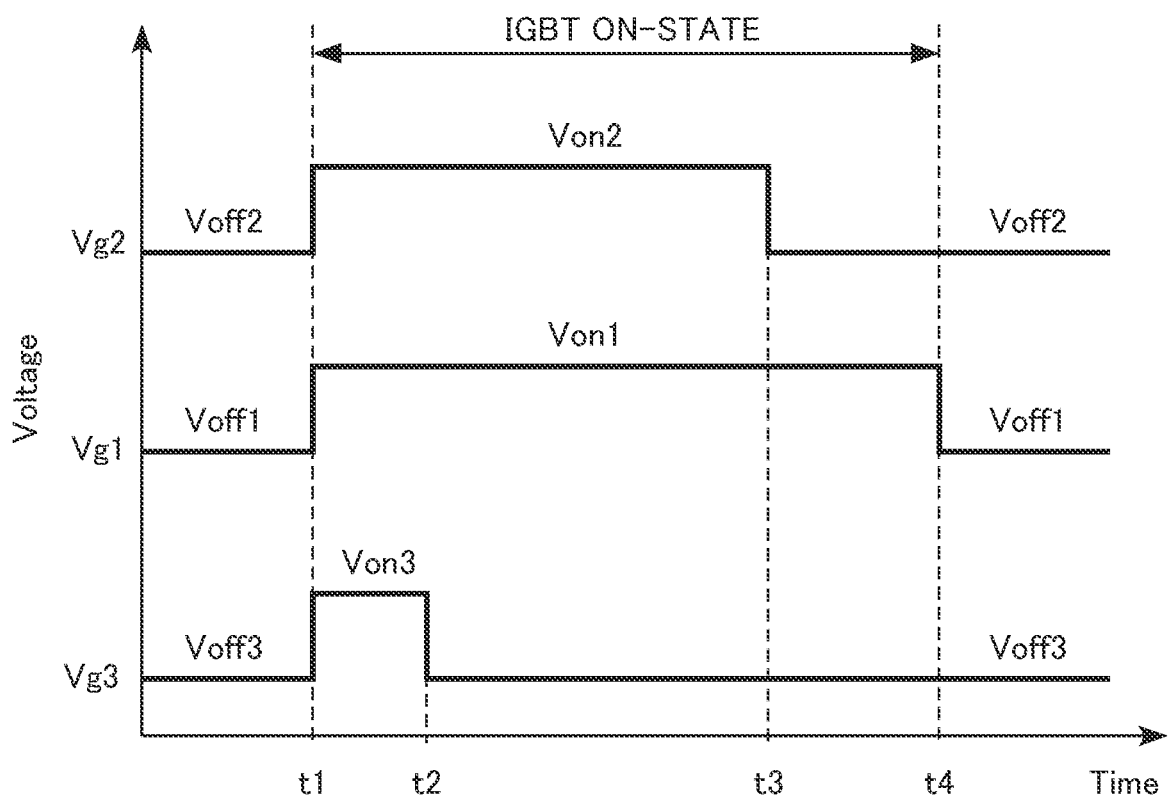
FIG. 6 is an explanatory diagram of a driving method for the semiconductor device according to the first embodiment.

FIG. 6 is an explanatory diagram of a driving method for the semiconductor device according to the first embodiment. FIG. 6 is a timing chart showing the first gate voltage (Vg1) applied to the first gate electrode pad 104, the second gate voltage (Vg2) applied to the second gate electrode pad 105, and the third gate voltage (Vg3) applied to the third gate electrode pad 106.

In the off-state of the IGBT, for example, an emitter voltage is applied to the upper electrode 12. The emitter voltage is, for example, 0 V. A collector voltage is applied to the lower electrode 14. The collector voltage is, for example, equal to or greater than 200 V and equal to or less than 6500 V.

In the off-state of the IGBT, the first turn-off voltage (Voff1) is applied to the first gate electrode pad 104. The first gate voltage (Vg1) becomes the first turn-off voltage (Voff1). Therefore, the first turn-off voltage (Voff1) is also applied to the first gate electrode 51.

The first turn-off voltage (Voff1) is a voltage less than a threshold voltage at which the transistor having the first gate electrode 51 is not turned on, and is, for example, 0 V or a negative voltage.

In the off-state, the n-type inversion layer is not formed in the cell base region 28 which is opposed to the first gate electrode 51 and in contact with the first gate insulating film 41.

In the off-state of the IGBT, the second turn-off voltage (Voff2) is applied to the second gate electrode pad 105. The second gate voltage (Vg2) becomes the second turn-off voltage (Voff2). Therefore, the second turn-off voltage (Voff2) is also applied to the second gate electrode 52.

The second turn-off voltage (Voff2) is a voltage less than a threshold voltage at which the transistor having the second gate electrode 52 is not turned on, and is, for example, 0 V or a negative voltage.

In the off-state, the n-type inversion layer is not formed in the cell base region 28 which is opposed to the second gate electrode 52 and in contact with the second gate insulating film 42.

In the off-state of the IGBT, the third turn-off voltage (Voff3) is applied to the third gate electrode pad 106. The third gate voltage (Vg3) becomes the third turn-off voltage (Voff3). Therefore, the third turn-off voltage (Voff3) is also applied to the third gate electrode 53.

The third turn-off voltage (Voff3) is a voltage less than a threshold voltage at which the transistor having the third gate electrode 53 is not turned on, and is, for example, 0 V.

In the off-state, the n-type inversion layer is not formed in the cell base region 28 which is opposed to the third gate electrode 53 and in contact with the third gate insulating film 43.

The third gate electrode pad 106 is also electrically connected to the fourth gate electrode 54 of the boundary region 103. Therefore, in the off-state of the IGBT, the third turn-off voltage (Voff3) is applied to the fourth gate electrode 54.

The third turn-off voltage (Voff3) is a voltage less than a threshold voltage at which the transistor having the fourth gate electrode 54 is not turned on.

In the off-state, the n-type inversion layer is not formed in the boundary base region 34 which is opposed to the fourth gate electrode 54 and in contact with the fourth gate insulating film 44.

At a time t1, the first turn-on voltage (Von1) is applied to the first gate electrode pad 104. The first gate voltage (Vg1) becomes the first turn-on voltage (Von1). The first turn-on voltage (Von1) is also applied to the first gate electrode 51.

The first turn-on voltage (Von1) is a positive voltage exceeding a threshold voltage of the transistor having the first gate electrode 51. The first turn-on voltage (Von1) is, for example, 15 V. The first turn-on voltage (Von1) is applied to the first gate electrode 51, and thus the transistor having the first gate electrode 51 is turned on after the time t1.

In the on-state, the n-type inversion layer is formed in the cell base region 28 which is opposed to the first gate electrode 51 and in contact with the first gate insulating film 41.

At the time t1, the second turn-on voltage (Von2) is applied to the second gate electrode pad 105. The second gate voltage (Vg2) becomes the second turn-on voltage (Von2). The second turn-on voltage (Von2) is also applied to the second gate electrode 52.

The second turn-on voltage (Von2) is a positive voltage exceeding a threshold voltage of the transistor having the second gate electrode 52. The second turn-on voltage (Von2) is, for example, 15 V. The second turn-on voltage (Von2) is applied to the second gate electrode 52, and thus the transistor having the second gate electrode 52 is turned on after the time t1.

In the on-state, the n-type inversion layer is formed in the cell base region 28 which is opposed to the second gate electrode 52 and in contact with the second gate insulating film 42.

At the time t1, the third turn-on voltage (Von3) is applied to the third gate electrode pad 106. The third gate voltage (Vg3) becomes the third turn-on voltage (Von3). The third turn-on voltage (Von3) is also applied to the third gate electrode 53.

The third turn-on voltage (Von3) is a positive voltage exceeding a threshold voltage of the transistor having the third gate electrode 53. The third turn-on voltage (Von3) is, for example, 15 V. The third turn-on voltage (Von3) is applied to the third gate electrode 53, and thus the transistor having the third gate electrode 53 is turned on after the time t1.

In the on-state, the n-type inversion layer is formed in the cell base region 28 which is opposed to the third gate electrode 53 and in contact with the third gate insulating film 43.

At the time t1, the third turn-on voltage (Von3) is also applied to the fourth gate electrode 54 of the boundary region 103.

The third turn-on voltage (Von3) is a positive voltage exceeding a threshold voltage of the transistor having the fourth gate electrode 54. The third turn-on voltage (Von3) is applied to the fourth gate electrode 54, and thus the transistor having the fourth gate electrode 54 of the boundary region 103 is turned on after the time t1.

In the on-state, the n-type inversion layer is formed in the boundary base region 34 which is opposed to the fourth gate electrode 54 and in contact with the fourth gate insulating film 44.

After the time t1, the IGBTs in the transistor region 101 and the boundary region 103 are turned on.

At a time t2, the third turn-off voltage (Voff3) is applied to the third gate electrode pad 106. The third gate voltage (Vg3) becomes the third turn-off voltage (Voff3). The third turn-off voltage (Voff3) is also applied to the third gate electrode 53 and the fourth gate electrode 54.

The third turn-off voltage (Voff3) is applied to the third gate electrode 53, and thus the transistor having the third gate electrode 53 is turned off after the time t2. The third turn-off voltage (Voff3) is applied to the fourth gate electrode 54, and thus the transistor having the fourth gate electrode 54 of the boundary region 103 is turned off after the time t2.

At a time t3, the second turn-off voltage (Voff2) is applied to the second gate electrode pad 105. The second gate voltage (Vg2) becomes the second turn-off voltage (Voff2). The second turn-off voltage (Voff2) is also applied to the second gate electrode 52.

The second turn-off voltage (Voff2) is applied to the second gate electrode 52, and thus the transistor having the second gate electrode 52 is turned off after the time t3.

For example, in a case where the second turn-off voltage (Voff2) is a negative voltage, the p-type inversion layer is formed in the drift region 27 in contact with the second gate insulating film 42. The second turn-off voltage (Voff2) is, for example, equal to or greater than −15 V and less than 0 V.

Figure 7:
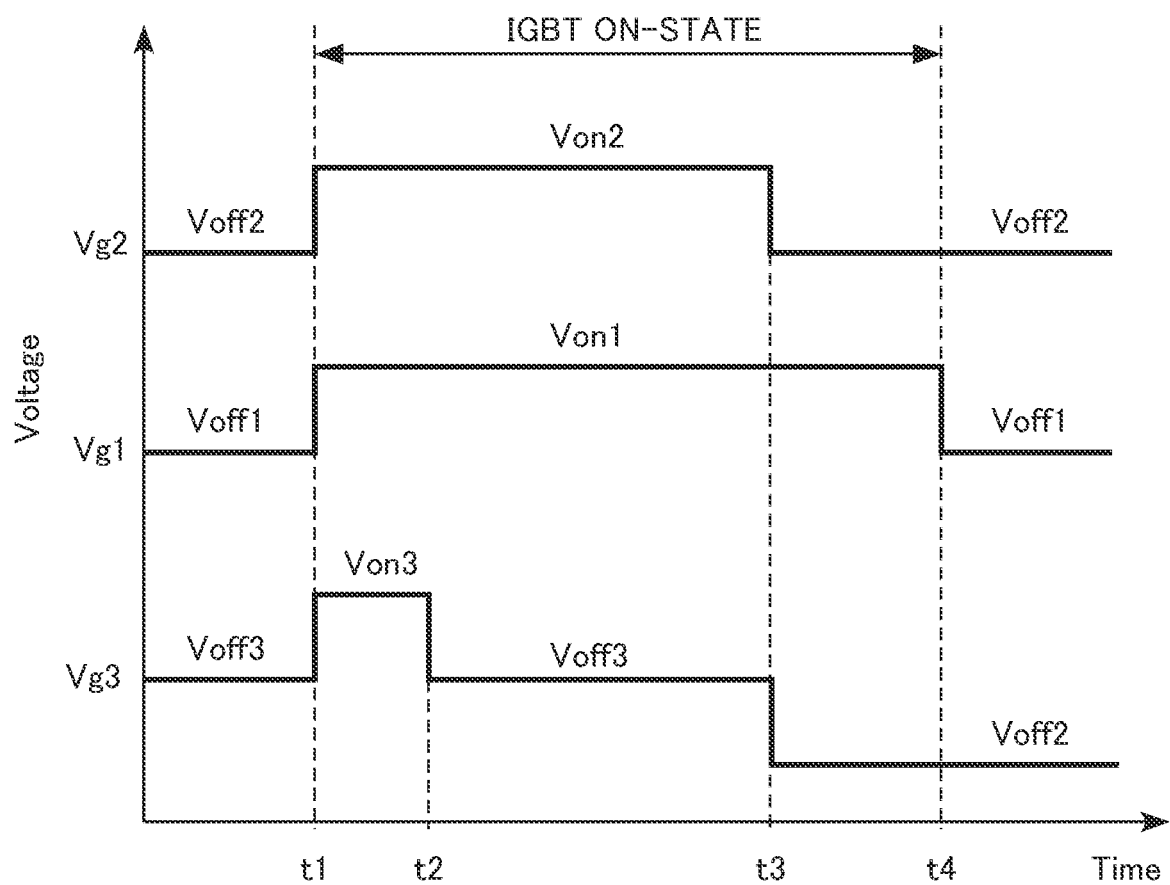
FIG. 7 is an explanatory diagram of a first modification example of the driving method for the semiconductor device according to the first embodiment.

FIG. 7 is an explanatory diagram of a first modification example of the driving method for the semiconductor device according to the first embodiment. As illustrated in FIG. 7, at the time t3, the second turn-off voltage (Voff2) is applied to the third gate electrode pad 106. The third gate voltage (Vg3) becomes the second turn-off voltage (Voff2). The second turn-off voltage (Voff2) is also applied to the third gate electrode 53 and the fourth gate electrode 54. In a case where the second turn-off voltage (Voff2) is a negative voltage, the p-type inversion layer is formed in the drift region 27 in contact with the third gate insulating film 43 and the fourth gate insulating film 44. The second turn-off voltage (Voff2) is, for example, equal to or greater than −15 V and less than 0 V.

At a time t4, the first turn-off voltage (Voff1) is applied to the first gate electrode pad 104. The first gate voltage (Vg1) becomes the first turn-off voltage (Voff1). The first turn-off voltage (Voff1) is also applied to the first gate electrode 51.

The first turn-off voltage (Voff1) is applied to the first gate electrode 51, and thus the transistor having the first gate electrode 51 is turned off after the time t4.

For example, in a case where the first turn-off voltage (Voff1) is a negative voltage, the p-type inversion layer is formed in the drift region 27 in contact with the first gate insulating film 41. The first turn-off voltage (Voff1) is, for example, equal to or greater than −15 V and less than 0 V.

Figure 8:
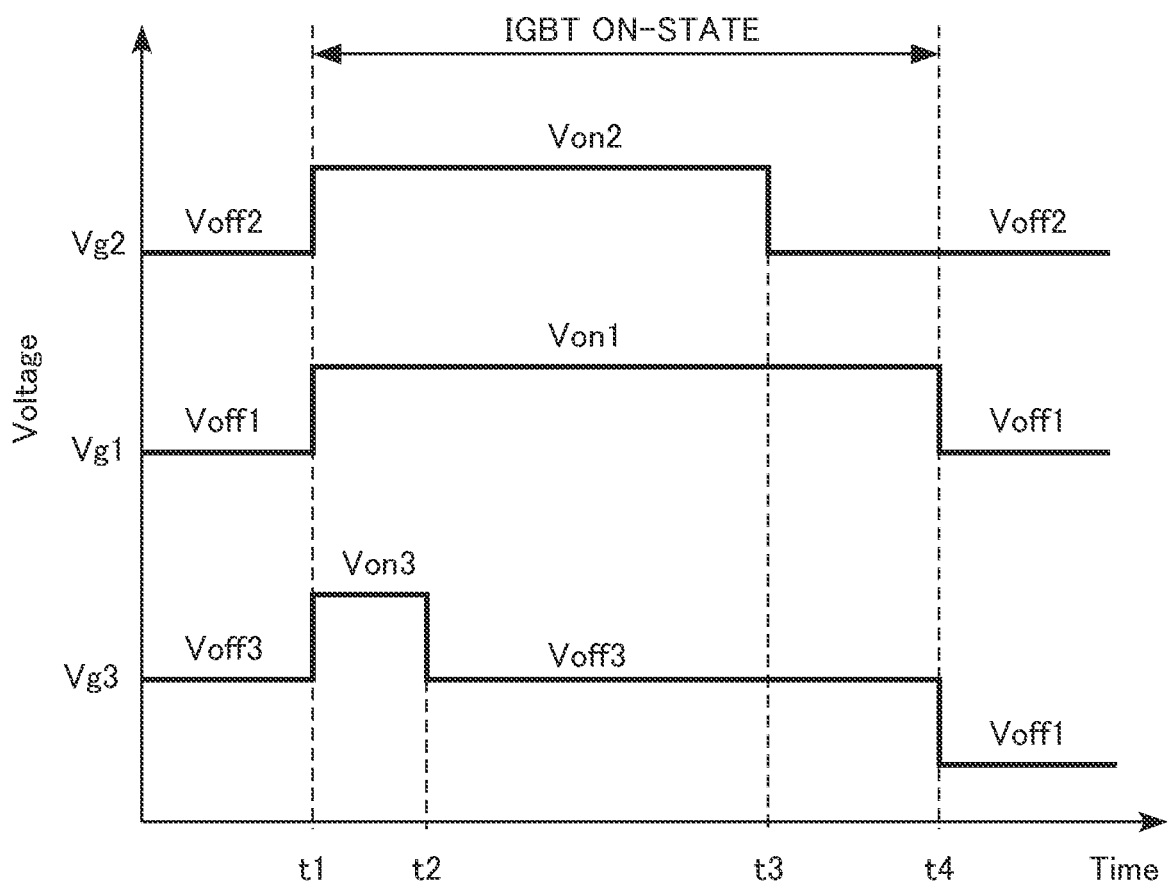
FIG. 8 is an explanatory diagram of a second modification example of the driving method for the semiconductor device according to the first embodiment.

FIG. 8 is an explanatory diagram of a second modification example of the driving method for the semiconductor device according to the first embodiment. As illustrated in FIG. 8, at the time t4, the first turn-off voltage (Voff1) may be applied to the third gate electrode pad 106. The third gate voltage (Vg3) becomes the first turn-off voltage (Voff1). The first turn-off voltage (Voff1) is also applied to the third gate electrode 53 and the fourth gate electrode 54. In a case where the first turn-off voltage (Voff1) is a negative voltage, the p-type inversion layer is formed in the drift region 27 in contact with the third gate insulating film 43 and the fourth gate insulating film 44. The first turn-off voltage (Voff1) is, for example, equal to or greater than −15 V and less than 0 V.

After the time t4, the transistor having the first gate electrode 51, the transistor having the second gate electrode 52, the transistor having the third gate electrode 53, and the transistor having the fourth gate electrode 54 are all turned off.

Next, functions and effects of the semiconductor device and the semiconductor circuit according to the first embodiment will be described.

In the RC-IGBT 100 of the first embodiment, the transistor having the first gate electrode 51, the transistor having the second gate electrode 52, and the transistor having the third gate electrode 53 are provided in the transistor region 101. It is possible to drive the transistors independently. With this configuration, the turn-on loss and the turn-off loss of the RC-IGBT 100 can be reduced.

In the RC-IGBT 100, the transistor having the fourth gate electrode 54 is provided in the boundary region 103. The transistor having the fourth gate electrode 54 is driven simultaneously with the transistor having the third gate electrode 53. With this configuration, the turn-on loss of the RC-IGBT 100 can be further reduced. Details thereof will be described below.

At the time t1, the transistor having the first gate electrode 51, the transistor having the second gate electrode 52, and the transistor having the third gate electrode 53 are all turned on and in the on-state. In the transistor region 101, electrons are injected into the drift region 27 from the cell emitter region 29. According to this, holes are injected into the drift region 27 from the collector region 26, and thus the transistor having the first gate electrode 51, the transistor having the second gate electrode 52, and the transistor having the third gate electrode 53 are all turned on.

For example, as compared with a case where the transistor having the third gate electrode 53 is not provided, the amount of electrons injected into the drift region 27 from the cell emitter region 29 increases, and according to this, the amount of holes injected into the drift region 27 from the collector region 26 also increases. Therefore, the turn-on time of the RC-IGBT 100 can be reduced. Accordingly, the turn-on loss of the RC-IGBT 100 is reduced.

At the time t2, the transistor having the third gate electrode 53 is turned off and in the off-state. The injection of the electrons into the drift region 27 by the transistor having the third gate electrode 53 is stopped. After the time t2, the transistor having the third gate electrode 53 functions as a dummy gate that does not contribute to the injection of the electrons.

When the injection of electrons into the drift region 27 by the transistor having the third gate electrode 53 is stopped, the carrier density of the drift region 27 on the cell emitter region 29 side decreases. Therefore, a saturation current of the RC-IGBT 100 can be suppressed. Accordingly, for example, the short circuit tolerance of the RC-IGBT 100 is improved.

At the time t3, the transistor having the second gate electrode 52 is turned off and in the off-state. After that, at the time t4, the transistor having the first gate electrode 51 is turned off and in the off-state. After the time t4, the IGBT in the transistor region 101 is turned off.

After the time t3, when the transistor having the second gate electrode 52 is turned off, the carrier density of the drift region 27 on the cell emitter region 29 side decreases. Therefore, when the transistor having the first gate electrode 51 is turned off, the amount of carriers to be discharged is reduced.

Therefore, the turn-off time of the RC-IGBT 100 can be reduced. Accordingly, the turn-off loss of the RC-IGBT 100 is reduced.

In particular, in a case where the second turn-off voltage (Voff2) applied to the second gate electrode 52 is a negative voltage, the p-type inversion layer is formed in the drift region 27 in contact with the second gate insulating film 42. Therefore, the discharge of holes from the drift region 27 to the upper electrode 12 is promoted until the time t4, and the amount of carriers to be discharged is further reduced when the transistor having the first gate electrode 51 is turned off. Accordingly, the turn-off loss of the RC-IGBT 100 is further reduced.

Figure 9:
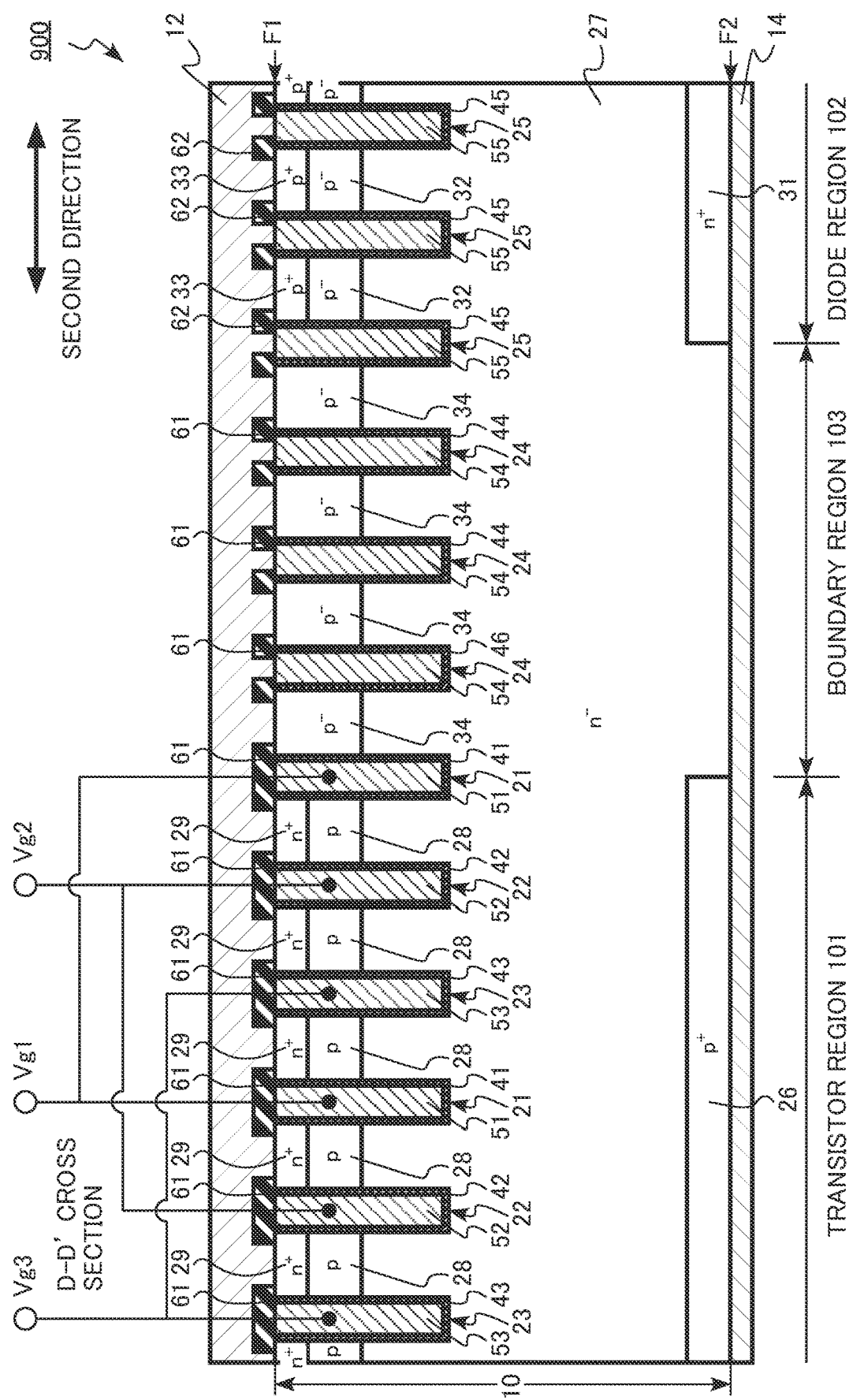
FIG. 9 is a partial schematic cross-sectional view of a semiconductor device according to a comparative example.

FIG. 9 is a partial schematic cross-sectional view of a semiconductor device according to a comparative example. FIG. 9 is a view corresponding to FIG. 2 of the first embodiment.

Figure 10:
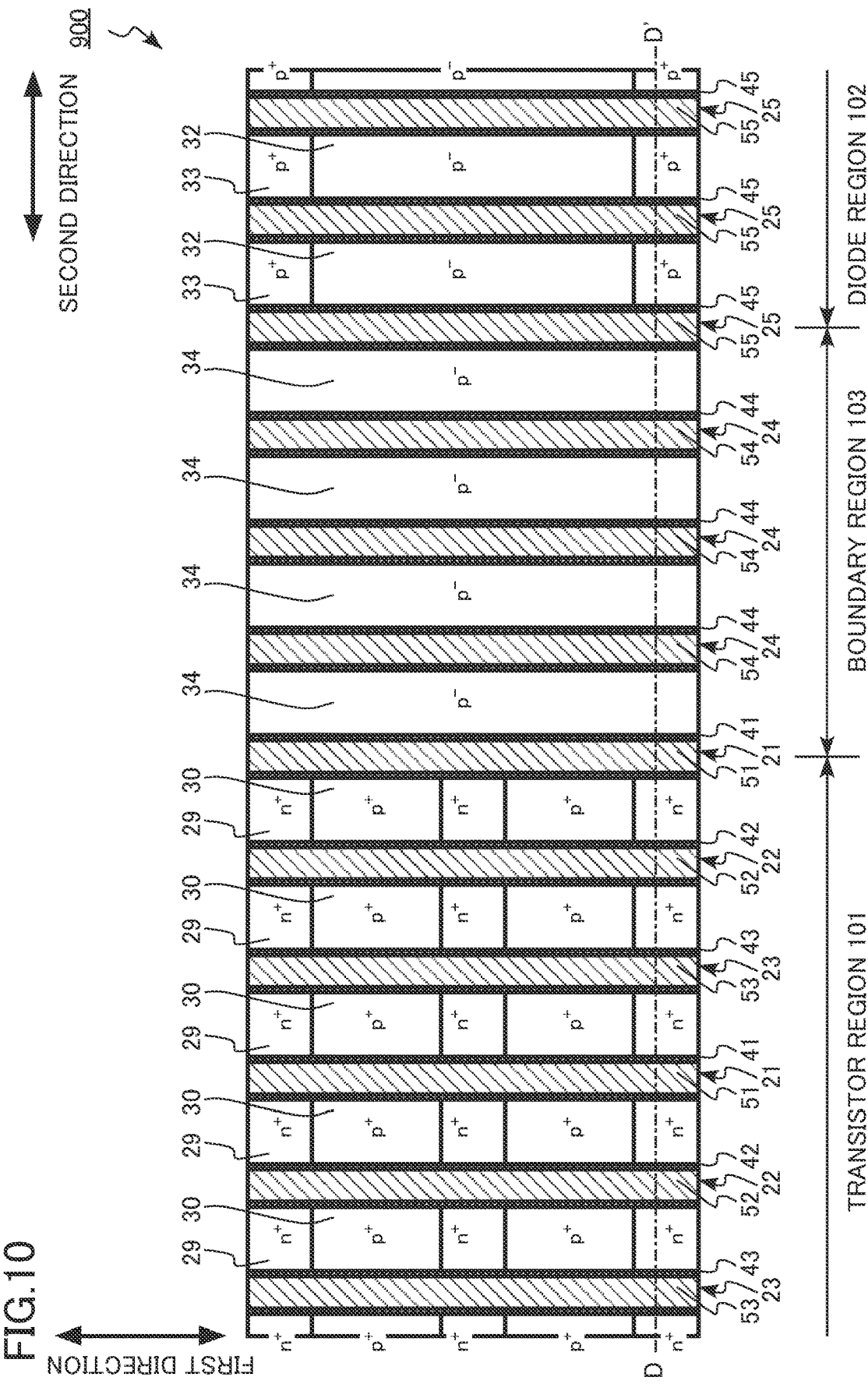
FIG. 10 is a partial schematic top view of a semiconductor device according to a comparative example.

FIG. 10 is a partial schematic top view of the semiconductor device according to the comparative example. FIG. 10 is a top view of the first face F1. FIG. 10 is a view corresponding to FIG. 3 of the first embodiment. FIG. 9 is a cross-sectional view taken along line D-D' of FIG. 10.

The semiconductor device of the comparative example is an RC-IGBT 900 in which an IGBT and a freewheeling diode are formed on the same semiconductor chip.

The semiconductor device of the comparative example is different from the RC-IGBT 100 of the first embodiment in that the fourth gate electrode 54 in the boundary region 103 is not connected to the third gate electrode pad 106. For example, the fourth gate electrode 54 of the boundary region 103 is electrically connected to the upper electrode 12. The RC-IGBT is different from the RC-IGBT 100 of the first embodiment in that the boundary emitter region 35 is not provided in the boundary region 103.

The RC-IGBT 900 of the comparative example is different from the RC-IGBT 900 of the first embodiment in that the transistor is not provided in the boundary region 103 and the boundary region 103 does not operate as the IGBT.

For example, a case where the RC-IGBT 900 is used to a switching element of an inverter circuit. When the IGBT of the RC-IGBT 900 is in the on-state, a high voltage is applied to the lower electrode 14 toward the upper electrode 12, and a current flows from the lower electrode 14 toward the upper electrode 12. When the IGBT of the RC-IGBT 900 is turned off, the current flowing from the lower electrode 14 toward the upper electrode 12 is blocked.

For example, in a case where an inductor is provided in a load of the inverter circuit, after the IGBT in the transistor region 101 is turned off, the diode in the diode region 102 is turned on, and a reflux current flows from the upper electrode 12 toward the lower electrode 14.

At the boundary between the transistor region 101 and the diode region 102, the transistor region 101 and the diode region 102 interfere with each other, and the property of the RC-IGBT 900 may be degraded. For example, when the diode of the diode region 102 is in the on-state, by injection of holes from the cell contact region 30 which is a high-concentration p-type region of the transistor region 101, the carrier density of the drift region 27 of the diode increases, and the recovery loss of the diode increases.

In order to avoid interference between the transistor region 101 and the diode region 102, in the RC-IGBT 900, the boundary region 103 in which neither the IGBT nor the diode exists is provided between the transistor region 101 and the diode region 102. By providing the boundary region 103, the property degradation of the RC-IGBT 900 is suppressed.

The boundary region 103 is an ineffective region that does not directly contribute to the operation of the IGBT in the transistor region 101 and the operation of the diode in the diode region 102.

In the RC-IGBT 100 of the first embodiment, the transistor having the fourth gate electrode 54 driven simultaneously with the transistor having the third gate electrode 53 is provided in the boundary region 103.

The transistor having the fourth gate electrode 54 is turned on at the time t1 of FIG. 6 and in the on-state. When the transistor including the fourth gate electrode 54 is turned on, electrons are injected into the drift region 27 from the boundary emitter region 35 in the boundary region 103.

Therefore, the amount of electrons injected into the drift region 27 increases as compared with the RC-IGBT 900 of the comparative example. According to this, the amount of holes injected into the drift region 27 from the collector region 26 also increases. Therefore, the turn-on time of the RC-IGBT 100 can be further reduced. Accordingly, the turn-on loss of the RC-IGBT 100 is further reduced.

In the RC-IGBT 100, the p-type impurity concentration of the boundary base region 34 is preferably lower than the p-type impurity concentration of the cell base region 28. By making the p-type impurity concentration of the boundary base region 34 lower than the p-type impurity concentration of the cell base region 28, the threshold voltage of the transistor having the fourth gate electrode 54 is lower than the threshold voltage of the transistor having the first gate electrode 51, the threshold voltage of the transistor having the second gate electrode 52, and the threshold voltage of the transistor having the third gate electrode 53.

Therefore, for example, in a case where a turn-on voltage is applied to the fourth gate electrode 54, the first gate electrode 51, the second gate electrode 52, and the third gate electrode 53 simultaneously at the time t1, the transistor having the fourth gate electrode 54 starts to be turned on early. Therefore, the amount of electrons injected into the drift region 27 increases early. Therefore, the turn-on time of the RC-IGBT 100 can be further reduced. Accordingly, the turn-on loss of the RC-IGBT 100 is further reduced.

By making the p-type impurity concentration of the boundary base region 34 lower than the p-type impurity concentration of the cell base region 28, injection of holes into the drift region 27 from the boundary base region 34 of the boundary region 103 can be suppressed when the diode of the diode region 102 is in the on-state. Therefore, an increase in the carrier density of the drift region 27 of the diode is suppressed, and an increase in the recovery loss of the diode can be suppressed. For example, the p-type impurity concentration of the boundary base region 34 is substantially equal to the anode region 32 of the diode region 102.

The occupation area ratio of the boundary contact region 36 on the first face F1 of the boundary region 103 is preferably smaller than the occupation area ratio of the cell contact region 30 on the first face F1 of the transistor region 101. The occupation area ratio of the boundary contact region 36 on the first face F1 of the boundary region 103 is preferably equal to or less than half the occupation area ratio of the cell contact region 30 on the first face F1 of the transistor region 101. For example, the occupation area ratio of the boundary contact region 36 may be substantially equal to the occupation area ratio of the diode contact region 33 of the diode region 102.

By making the occupation area ratio of the boundary contact region 36 on the first face F1 of the boundary region 103 smaller than the occupation area ratio of the cell contact region 30 on the first face F1 of the transistor region 101, the injection of holes into the drift region 27 from the boundary base region 34 of the boundary region 103 can be suppressed when the diode of the diode region 102 is in the on-state. Therefore, an increase in the carrier density of the drift region 27 of the diode is suppressed, and an increase in the recovery loss of the diode can be suppressed. By making the occupation area ratio of the boundary contact region 36 substantially equal to the occupation area ratio of the diode contact region 33 of the diode region 102, the amount of the injection of holes into the drift region 27 in the diode region 102 and the boundary region 103 can be uniformed when the diode of the diode region 102 is in the on-state. Therefore, the boundary region 103 can also contribute to the operation as a diode.

The occupation area ratio of the fourth gate electrode 54 in a cross section parallel to the first face F1 of the boundary region 103 is preferably greater than the occupation area ratio of the third gate electrode 53 in the cross section of the transistor region 101. By increasing the occupation area ratio of the fourth gate electrode 54, the amount of electrons injected into the drift region 27 further increases in the boundary region 103. Therefore, the turn-on time of the RC-IGBT 100 can be further reduced. Accordingly, the turn-on loss of the RC-IGBT 100 is further reduced. On the other hand, when the IGBT after the time t2 is in the on-state, the transistor having the first gate electrode 51 and the transistor having the second gate electrode 52, which are turned on, are not disposed in the boundary region 103 such that only the transistor having the fourth gate electrode 54 in the boundary region 103 having a low threshold voltage can be turned off. Therefore, it is possible to suppress the breakdown of the IGBT, which is caused due to a mixture of the transistors having the low threshold voltage.

As described above, according to the first embodiment, it is possible to realize a semiconductor device which includes an RC-IGBT having an IGBT and a diode and makes the turn-on loss capable of being reduced, and a semiconductor circuit.

Second Embodiment

A semiconductor device of the second embodiment is different from the semiconductor device of the first embodiment in that the first semiconductor region is provided between the ninth semiconductor region and the second face. Hereinafter, description of the contents overlapping with the first embodiment may be partially omitted.

Figure 11:
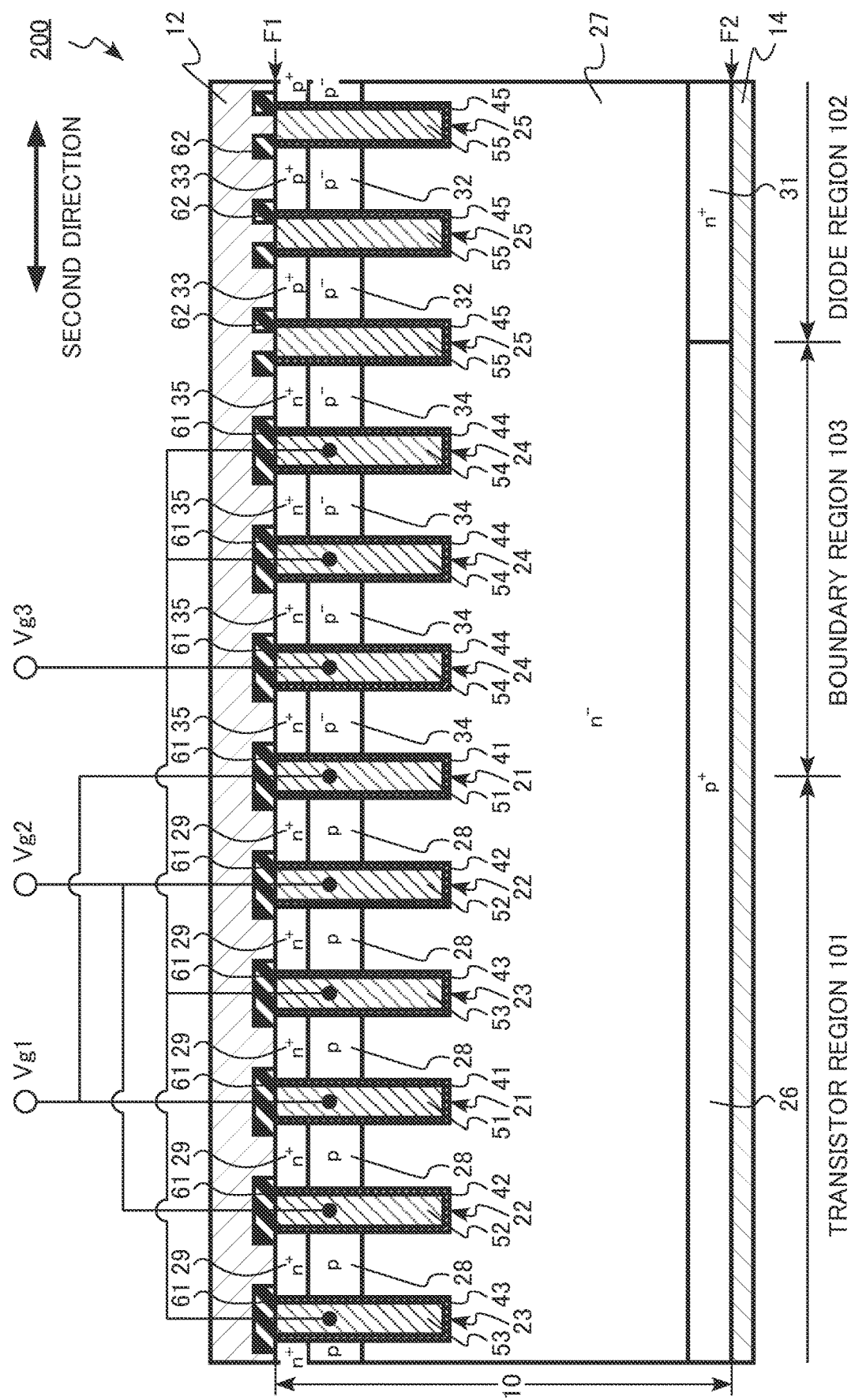
FIG. 11 is a partial schematic cross-sectional view of a semiconductor device according to a second embodiment.

FIG. 11 is a partial schematic cross-sectional view of the semiconductor device according to the second embodiment. FIG. 11 is a view corresponding to FIG. 2 of the first embodiment.

The semiconductor device of the second embodiment is an RC-IGBT 200 in which an IGBT and a freewheeling diode are formed on the same semiconductor chip.

In the RC-IGBT 200, the boundary region 103 includes the collector region 26. The collector region 26 is provided between the boundary base region 34 and the second face F2. The collector region 26 is in contact with the lower electrode 14 in the boundary region 103.

In the RC-IGBT 200, the boundary region 103 includes the collector region 26, and thus the amount of electrons injected into the drift region 27 further increases in the boundary region 103 as compared with the RC-IGBT 100. Therefore, the turn-on time of the RC-IGBT 200 can be further reduced. Accordingly, the turn-on loss of the RC-IGBT 200 is further reduced.

As described above, according to the second embodiment, it is possible to realize a semiconductor device which includes an RC-IGBT having an IGBT and a diode and makes the turn-on loss capable of being reduced.

Third Embodiment

A semiconductor device of the third embodiment is different from the semiconductor device of the first embodiment in that the semiconductor device of the third embodiment further includes a twelfth semiconductor region of a second conductivity type, which is provided in the semiconductor layer, is provided between the second semiconductor region and the third semiconductor region, is provided between the second semiconductor region and the ninth semiconductor region, and has a second conductivity type impurity concentration higher than the second conductivity type impurity concentration of the second semiconductor region. Hereinafter, description of the contents overlapping with the first embodiment may be partially omitted.

Figure 12:
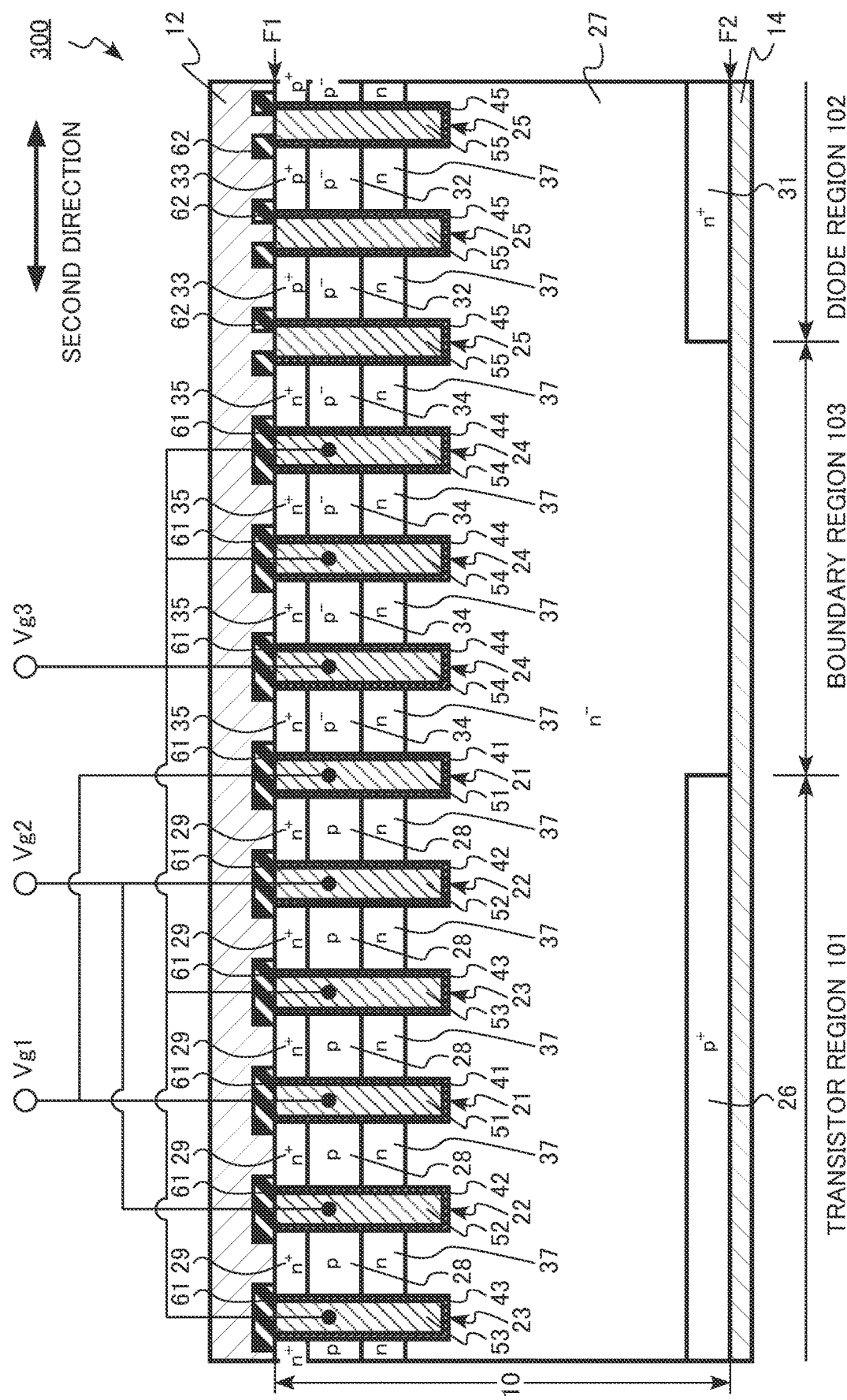
FIG. 12 is a partial schematic cross-sectional view of a semiconductor device according to a third embodiment.

FIG. 12 is a partial schematic cross-sectional view of the semiconductor device according to the third embodiment. FIG. 12 is a view corresponding to FIG. 2 of the first embodiment.

The semiconductor device of the third embodiment is an RC-IGBT 300 in which an IGBT and a freewheeling diode are formed on the same semiconductor chip.

The RC-IGBT 300 includes a barrier region 37 (twelfth semiconductor region). In the transistor region 101, the barrier region 37 is provided between the drift region 27 and the cell base region 28. In the boundary region 103, the barrier region 37 is provided between the drift region 27 and the boundary base region 34. In the diode region 102, the barrier region 37 is provided between the drift region 27 and the anode region 32.

The barrier region 37 is an n-type semiconductor region. The n-type impurity concentration of the barrier region 37 is higher than the n-type impurity concentration of the drift region 27.

According to the RC-IGBT 300, the barrier region 37 is provided, and thus the carrier density of the drift region 27 on the cell base region 28 side increases when the IGBT is in the on-state. Therefore, the on-resistance is reduced as compared with the RC-IGBT 100. Accordingly, the steady loss of the RC-IGBT 300 is reduced.

As described above, according to the third embodiment, it is possible to realize a semiconductor device which includes an RC-IGBT having an IGBT and a diode and makes the turn-on loss capable of being reduced.

Fourth Embodiment

A semiconductor device of the fourth embodiment is different from the semiconductor device of the third embodiment in that a depth of a ninth semiconductor region in a direction from a first face to a second face is smaller than a depth of a third semiconductor region in the direction from the first face to the second face. Hereinafter, descriptions overlapping with those in the first embodiment and the third embodiment will be partially omitted.

Figure 13:
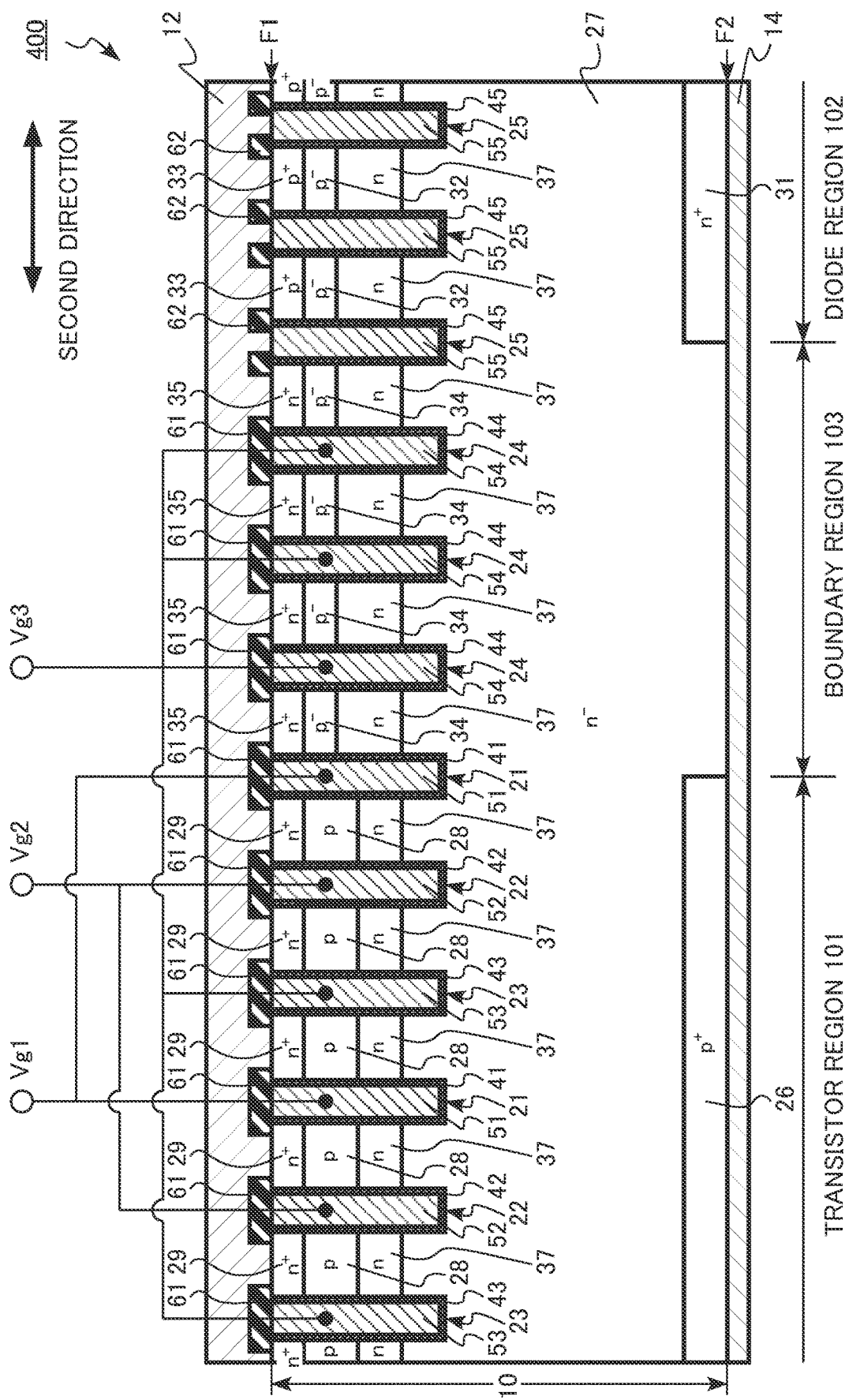
FIG. 13 is a partial schematic cross-sectional view of a semiconductor device according to a fourth embodiment.

FIG. 13 is a partial schematic cross-sectional view of the semiconductor device according to the fourth embodiment. FIG. 13 is a view corresponding to FIG. 2 of the first embodiment.

The semiconductor device of the fourth embodiment is an RC-IGBT 400 in which an IGBT and a freewheeling diode are formed on the same semiconductor chip.

The RC-IGBT 400 includes a barrier region 37 (twelfth semiconductor region). In the transistor region 101, the barrier region 37 is provided between the drift region 27 and the cell base region 28. In the boundary region 103, the barrier region 37 is provided between the drift region 27 and the boundary base region 34. In the diode region 102, the barrier region 37 is provided between the drift region 27 and the anode region 32.

The barrier region 37 is an n-type semiconductor region. The n-type impurity concentration of the barrier region 37 is higher than the n-type impurity concentration of the drift region 27.

In the RC-IGBT 400, a depth of the boundary base region 34 in the direction from the first face F1 toward the second face F2 is smaller than a depth of the cell base region 28 in the direction from the first face F1 toward the second face F2. A depth of the anode region 32 in the direction from the first face F1 toward the second face F2 is smaller than a depth of the cell base region 28 in the direction from the first face F1 toward the second face F2.

According to the RC-IGBT 400, in a similar manner to the RC-IGBT 300 of the third embodiment, the barrier region 37 is provided, and thus the carrier density of the drift region 27 on the cell base region 28 side increases when the IGBT is in the on-state. Accordingly, the steady loss of the RC-IGBT 400 is reduced.

In the RC-IGBT 400, the boundary base region 34 is shallower than cell base region 28, and thus a channel length of the transistor having the fourth gate electrode 54 is shorter than a channel length of the transistor having the first gate electrode 51, a channel length of the transistor having the second gate electrode 52, and a channel length of the transistor having the third gate electrode 53.

Therefore, for example, in a case where a turn-on voltage is applied to the fourth gate electrode 54, the first gate electrode 51, the second gate electrode 52, and the third gate electrode 53 simultaneously at the time t1, the transistor having the fourth gate electrode 54 starts to be turned on early. The on-current of the transistor having the fourth gate electrode 54 increases.

Therefore, the amount of electrons injected into the drift region 27 increases early. Therefore, the turn-on time of the RC-IGBT 400 can be further reduced. Accordingly, the turn-on loss of the RC-IGBT 400 is further reduced.

Modification Example

Figure 14:
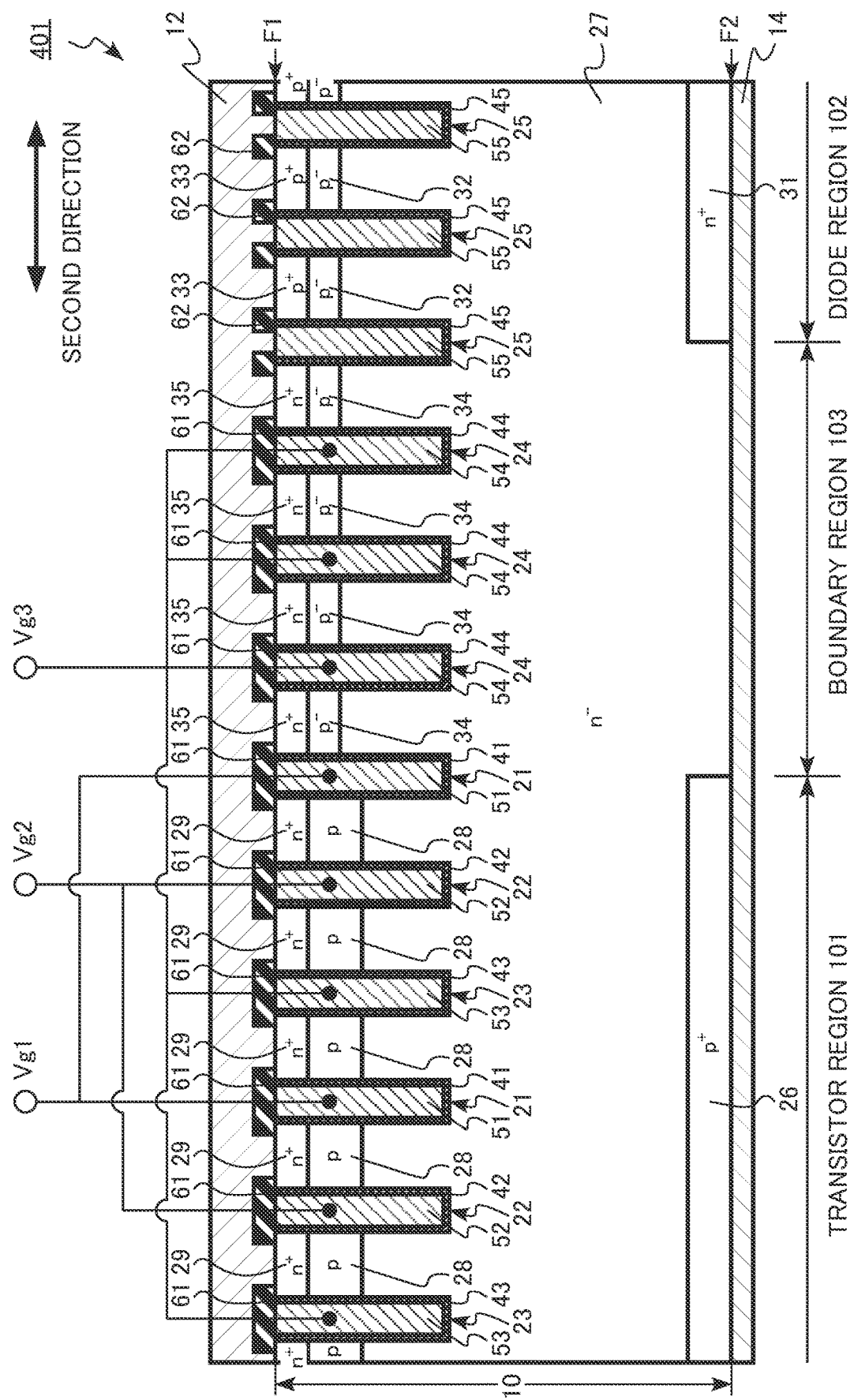
FIG. 14 is a partial schematic cross-sectional view of a semiconductor device according to a modification example of the fourth embodiment.

FIG. 14 is a partial schematic cross-sectional view of a semiconductor device according to the modification example of the fourth embodiment. FIG. 14 is a view corresponding to FIG. 13 of the fourth embodiment.

The semiconductor device of the modification example of the fourth embodiment is an RC-IGBT 401 in which an IGBT and a freewheeling diode are formed on the same semiconductor chip.

The RC-IGBT 401 of the modification example is different from the RC-IGBT 400 of the fourth embodiment in that the barrier region 37 is not provided.

In the RC-IGBT 401 of the modification example, a depth of the boundary base region 34 in a direction from the first face F1 toward the second face F2 is smaller than a depth of the cell base region 28 in the direction from the first face F1 toward the second face F2. The RC-IGBT 401 of the modification example further reduces the turn-on loss of the RC-IGBT 401 by the same function as that of the RC-IGBT 400 of the fourth embodiment.

As described above, according to the fourth embodiment and the modification example, it is possible to realize a semiconductor device which includes an RC-IGBT having an IGBT and a diode and makes the turn-on loss capable of being reduced.

Fifth Embodiment

A semiconductor device of the fifth embodiment is different from the semiconductor device of the first embodiment in that the diode region further includes a thirteenth semiconductor region of a first conductivity type, which is provided in the semiconductor layer and provided between the second semiconductor region and the second face, and the second electrode is in contact with the thirteenth semiconductor region. Hereinafter, description of the contents overlapping with the first embodiment may be partially omitted.

Figure 15:
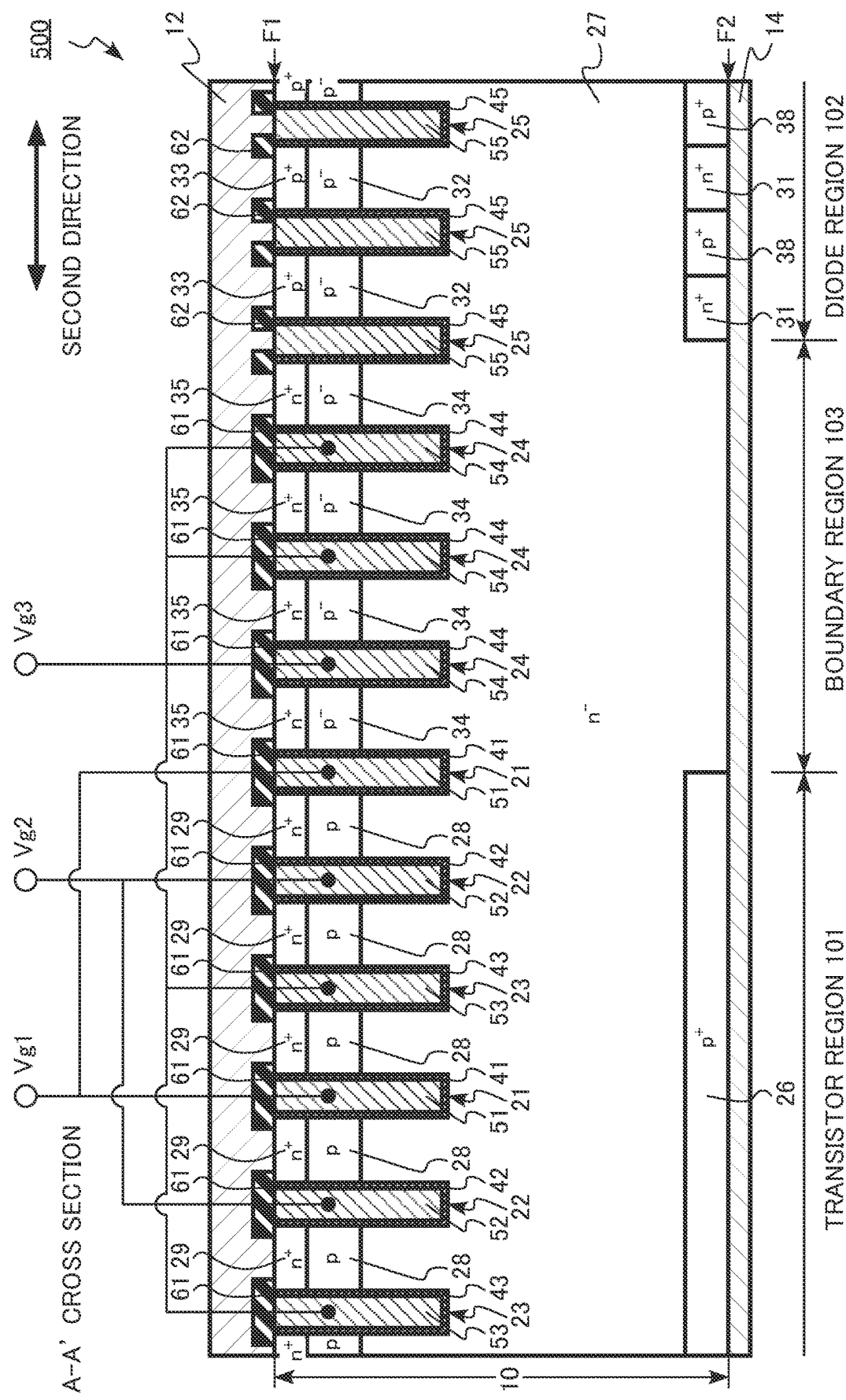
FIG. 15 is a partial schematic cross-sectional view of a semiconductor device according to a fifth embodiment.

FIG. 15 is a partial schematic cross-sectional view of the semiconductor device according to the fifth embodiment. FIG. 15 is a view corresponding to FIG. 2 of the first embodiment.

The semiconductor device of the fifth embodiment is an RC-IGBT 500 in which an IGBT and a freewheeling diode are formed on the same semiconductor chip.

The RC-IGBT 500 includes a p-type region 38 (thirteenth semiconductor region) in the semiconductor layer 10 of the diode region 102. The p-type region 38 is provided between the drift region 27 and the second face F2. The p-type region 38 is provided between the anode region 32 and the second face F2.

The p-type region 38 is in contact with the second face F2. The p-type region 38 is in contact with the lower electrode 14.

For example, the p-type region 38 and the cathode region 31 are alternately disposed in the second direction.

The p-type region 38 is a $p^+$-type semiconductor region.

In the RC-IGBT 500, the p-type region 38 is provided, and thus the oscillation of the diode in the diode region 102 during the recovery operation is suppressed.

As described above, according to the fifth embodiment, it is possible to realize a semiconductor device which includes an RC-IGBT having an IGBT and a diode and makes the turn-on loss capable of being reduced.

In the first to fifth embodiments, the case where the semiconductor layer is formed of single crystal silicon has been described as an example, but the semiconductor layer is not limited to the single crystal silicon. For example, other single crystal semiconductors such as single crystal silicon carbide may be used.

In the first to fifth embodiments, the case of a stripe shape in which the trenches are disposed in parallel has been described as an example, but the present disclosure can also be applied to a mesh-shaped trench in which the trenches intersect with each other or a dot-shaped trench.

In the first to fifth embodiments, the case where the first conductivity type is p-type and the second conductivity type is n-type has been described as an example, but the first conductivity type may be n-type and the second conductivity type may be p-type.

While certain embodiments have been described, these embodiments have been presented by way of example only, and are not intended to limit the scope of the inventions. Indeed, the semiconductor device and semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a transistor region including
a semiconductor layer having a first face and a second face opposed to the first face,
a first semiconductor region of a first conductivity type provided in the semiconductor layer,
a second semiconductor region of a second conductivity type provided in the semiconductor layer and provided between the first semiconductor region and the first face,
a third semiconductor region of a first conductivity type provided in the semiconductor layer and provided between the second semiconductor region and the first face,
a fourth semiconductor region of a second conductivity type provided in the semiconductor layer and provided between the third semiconductor region and the first face,
a fifth semiconductor region of a first conductivity type provided in the semiconductor layer, provided between the third semiconductor region and the first face, and having a first conductivity type impurity concentration higher than the first conductivity type impurity concentration of the third semiconductor region,
a first trench provided on a side of the first face in the semiconductor layer and in contact with the second semiconductor region, the third semiconductor region, and the fourth semiconductor region,
a first gate electrode provided in the first trench,
a first gate insulating film provided between the first gate electrode and the second semiconductor region, between the first gate electrode and the third semiconductor region, and between the first gate electrode and the fourth semiconductor region,
a second trench provided on a side of the first face in the semiconductor layer and in contact with the second semiconductor region, the third semiconductor region, and the fourth semiconductor region;
a second gate electrode provided in the second trench,
a second gate insulating film provided between the second gate electrode and the second semiconductor region, between the second gate electrode and the third semiconductor region, and between the second gate electrode and the fourth semiconductor region,
a third trench provided on a side of the first face in the semiconductor layer and in contact with the second semiconductor region, the third semiconductor region, and the fourth semiconductor region,
a third gate electrode provided in the third trench,
a third gate insulating film provided between the third gate electrode and the second semiconductor region, between the third gate electrode and the third semiconductor region, and between the third gate electrode and the fourth semiconductor region,
a first electrode provided on a side of the first face with respect to the semiconductor layer and in contact with the fourth semiconductor region and the fifth semiconductor region, and
a second electrode provided on a side of the second face with respect to the semiconductor layer and in contact with the first semiconductor region;
a diode region including
the semiconductor layer,
the second semiconductor region,
a sixth semiconductor region of a second conductivity type provided in the semiconductor layer, provided between the second semiconductor region and the second face, and having a second conductivity type impurity concentration higher than the second conductivity type impurity concentration of the second semiconductor region,
a seventh semiconductor region of a first conductivity type provided in the semiconductor layer and provided between the second semiconductor region and the first face,
an eighth semiconductor region of a first conductivity type provided in the semiconductor layer, provided between the seventh semiconductor region and the first face, and having a first conductivity type impurity concentration higher than the first conductivity type impurity concentration of the seventh semiconductor region,
a fifth trench provided on a side of the first face in the semiconductor layer and in contact with the second semiconductor region and the seventh semiconductor region,
a conductive layer provided in the fifth trench,
an insulating film provided between the conductive layer and the second semiconductor region and between the conductive layer and the seventh semiconductor region,
the first electrode in contact with the eighth semiconductor region, and
the second electrode in contact with the sixth semiconductor region;
a boundary region provided between the transistor region and the diode region, the boundary region including
the semiconductor layer,
the second semiconductor region,
a ninth semiconductor region of a first conductivity type provided in the semiconductor layer and provided between the second semiconductor region and the first face,
a tenth semiconductor region of a second conductivity type provided in the semiconductor layer and provided between the ninth semiconductor region and the first face,
an eleventh semiconductor region of a first conductivity type provided in the semiconductor layer, provided between the ninth semiconductor region and the first face, and having a first conductivity type impurity concentration higher than the first conductivity type impurity concentration of the ninth semiconductor region,
a fourth trench provided on a side of the first face in the semiconductor layer and in contact with the second semiconductor region, the ninth semiconductor region, and the tenth semiconductor region,
a fourth gate electrode provided in the fourth trench,
a fourth gate insulating film provided between the fourth gate electrode and the second semiconductor region, between the fourth gate electrode and the ninth semiconductor region, and between the fourth gate electrode and the tenth semiconductor region,
the first electrode in contact with the tenth semiconductor region and the eleventh semiconductor region, and
the second electrode;

a first electrode pad provided on a side of the first face with respect to the semiconductor layer and electrically connected to the first gate electrode;

a second electrode pad provided on a side of the first face with respect to the semiconductor layer and electrically connected to the second gate electrode; and a third electrode pad provided on a side of the first face with respect to the semiconductor layer and electrically connected to the third gate electrode and the fourth gate electrode.

2. The semiconductor device according to claim 1, wherein the first conductivity type impurity concentration of the ninth semiconductor region is lower than the first conductivity type impurity concentration of the third semiconductor region.

3. The semiconductor device according to claim 1, wherein an occupation area ratio of the eleventh semiconductor region on the first face of the boundary region is smaller than the occupation area ratio of the fifth semiconductor region on the first face of the transistor region.

4. The semiconductor device according to claim 1, wherein an occupation area ratio of the fourth gate electrode in a cross section parallel to the first face of the boundary region is greater than the occupation area ratio of the third gate electrode in the cross section of the transistor region.

5. The semiconductor device according to claim 1, wherein the first semiconductor region is provided between the ninth semiconductor region and the second face.

6. The semiconductor device according to claim 1, further comprising a twelfth semiconductor region of a second conductivity type provided in the semiconductor layer, provided between the second semiconductor region and the third semiconductor region, provided between the second semiconductor region and the ninth semiconductor region, and having a second conductivity type impurity concentration higher than the second conductivity type impurity concentration of the second semiconductor region.

7. The semiconductor device according to claim 1, wherein a depth of the ninth semiconductor region in a direction from the first face toward the second face is smaller than a depth of the third semiconductor region in the direction from the first face toward the second face.

8. The semiconductor device according to claim 1, wherein the diode region further includes a thirteenth semiconductor region of a first conductivity type provided in the semiconductor layer and provided between the second semiconductor region and the second face, and the second electrode is in contact with the thirteenth semiconductor region.

9. The semiconductor device according to claim 1, wherein the conductive layer is electrically connected to the first electrode.

10. The semiconductor device according to claim 1, wherein:

a first turn-on voltage is applied to the first electrode pad (104);

a second turn-on voltage is applied to the second electrode pad (105);

a third turn-on voltage is applied to the third electrode pad (106);

a third turn-off voltage is applied to the third electrode pad, after the first turn-on voltage is applied to the first electrode pad (104), after the second turn-on voltage is applied to the second electrode pad, and after the third turn-on voltage is applied to the third electrode pad;

a second turn-off voltage is applied to the second electrode pad after the third turn-off voltage is applied to the third electrode pad; and a first turn-off voltage is applied to the first electrode pad after the second turn-off voltage is applied to the second electrode pad.

11. A semiconductor circuit comprising:

the semiconductor device according to claim 1; and a control circuit configure to:

drive the semiconductor device, apply a first turn-on voltage to the first electrode pad, a second turn-on voltage to the second electrode pad, and a third turn-on voltage to the third electrode pad;

apply a third turn-off voltage to the third electrode pad after applying the first turn-on voltage to the first electrode pad, the second turn-on voltage to the second electrode pad, and the third turn-on voltage to the third electrode pad;

apply a second turn-off voltage to the second electrode pad after applying the third turn-off voltage to the third electrode pad; and apply a first turn-off voltage to the first electrode pad after applying the second turn-off voltage to the second electrode pad.

* * * * *